US012677487B2

(12) United States Patent
Miyake et al.

(10) Patent No.: US 12,677,487 B2
(45) Date of Patent: Jul. 7, 2026

(54) IMAGING ELEMENT AND SEMICONDUCTOR ELEMENT

(71) Applicant: SONY SEMICONDUCTOR SOLUTIONS CORPORATION, Kanagawa (JP)

(72) Inventors: Shinichi Miyake, Kanagawa (JP); Hirofumi Yamashita, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 61 days.

(21) Appl. No.: 18/635,309

(22) Filed: Apr. 15, 2024

(65) Prior Publication Data

US 2024/0266381 A1 Aug. 8, 2024

Related U.S. Application Data

(63) Continuation of application No. 17/437,101, filed as application No. PCT/JP2020/010981 on Mar. 13, 2020, now Pat. No. 12,027,562.

(30) Foreign Application Priority Data

Mar. 15, 2019 (JP) ................................. 2019-048551

(51) Int. Cl.
*H10F 39/18* (2025.01)
*H04N 25/778* (2023.01)
(Continued)

(52) U.S. Cl.
CPC ....... *H10F 39/1843* (2025.01); *H04N 25/778* (2023.01); *H04N 25/79* (2023.01); *H10F 39/8023* (2025.01); *H10F 39/813* (2025.01)

(58) Field of Classification Search
CPC ........... H01L 27/1465; H01L 27/14605; H01L 27/14641; H01L 27/14636;
(Continued)

(56) References Cited

U.S. PATENT DOCUMENTS

2009/0212336 A1 8/2009 Iwata et al.
2015/0179691 A1* 6/2015 Yanagita ............... H10F 39/811
257/292
(Continued)

FOREIGN PATENT DOCUMENTS

CN 101729805 A 6/2010
CN 102097444 A 6/2011
(Continued)

OTHER PUBLICATIONS

International Search Report and Written Opinion for International (PCT) Patent Application No. PCT/JP2020/010981, dated May 12, 2020, 6 pages.
(Continued)

*Primary Examiner* — Tony Ko
(74) *Attorney, Agent, or Firm* — SHERIDAN ROSS P.C.

(57) ABSTRACT

An imaging element according to an embodiment of the present disclosure includes a first semiconductor substrate, and a second semiconductor substrate stacked over the first semiconductor substrate with an insulating layer interposed therebetween. The first semiconductor substrate includes a photoelectric conversion section, and a charge-holding section that holds charges transferred from the photoelectric conversion section. The second semiconductor substrate includes an amplification transistor that generates a signal of a voltage corresponding to a level of charges held in the charge-holding section. The amplification transistor includes a channel region, a source region, and a drain region in a plane intersecting a front surface of the second semiconductor substrate, and includes a gate electrode being opposed to the channel region with a gate insulating film interposed therebetween and being electrically coupled to the charge-holding section.

20 Claims, 39 Drawing Sheets

(51) Int. Cl.
   *H04N 25/79*          (2023.01)
   *H10F 39/00*         (2025.01)

(58) Field of Classification Search
   CPC ......... H01L 27/14638; H01L 27/14689; H01L
                   27/14603; H01L 27/14634; H01L
                   27/1464; H01L 27/14614; H01L 23/522;
                   H04N 25/778; H04N 25/79; H04N 25/75
   See application file for complete search history.

(56)                   References Cited

U.S. PATENT DOCUMENTS

| | | |
|---|---|---|
| 2017/0018591 A1 | 1/2017 | Yamaguchi et al. |
| 2017/0077155 A1 | 3/2017 | Sano et al. |
| 2019/0057997 A1 | 2/2019 | Togashi et al. |
| 2019/0123079 A1* | 4/2019 | Kudoh ................. H10D 64/513 |
| 2022/0181364 A1 | 6/2022 | Miyake et al. |

FOREIGN PATENT DOCUMENTS

| | | |
|---|---|---|
| CN | 104054176 A | 9/2014 |
| CN | 104428897 A | 3/2015 |
| CN | 108886046 A | 11/2018 |
| EP | 3358622 | 8/2018 |
| JP | 2010-245506 | 10/2010 |
| JP | 2014-022561 | 2/2014 |
| JP | 2015-032687 | 2/2015 |
| JP | 2015-162668 | 9/2015 |
| JP | 2017-027982 | 2/2017 |
| JP | 2017183636 A | 10/2017 |
| KR | 20150037812 A | 4/2015 |
| TW | 201633532 | 9/2016 |
| WO | WO 2017/169884 | 10/2017 |

OTHER PUBLICATIONS

Notice of Allowance for U.S. Appl. No. 17/437,101, dated Jan. 18, 2024, 9 pages.

* cited by examiner

IMAGING ELEMENT AND SEMICONDUCTOR ELEMENT

CROSS REFERENCE TO RELATED APPLICATIONS

This application is a continuation of U.S. patent application Ser. No. 17/437,101, filed Sep. 8, 2021, which is a national stage application under 35 U.S.C. 371 and claims the benefit of PCT Application No. PCT/JP2020/010981, having an international filing date of Mar. 13, 2020, which designated the United States, which PCT application claimed the benefit of Japanese Patent Application No. 2019-048551 filed Mar. 15, 2019, the entire disclosures of each of which are incorporated herein by reference.

TECHNICAL FIELD

The present disclosure relates to an imaging element and a semiconductor element.

BACKGROUND ART

Miniaturization of an area per pixel of a two-dimensionally structured imaging element has heretofore been achieved by introduction of a miniaturizing process and improvement in packaging density. In recent years, in order to achieve further size reduction in an imaging element and higher pixel density, a three-dimensionally structured imaging element has been developed. In the three-dimensionally structured imaging element, for example, a semiconductor substrate including a plurality of photoelectric conversion sections and a semiconductor substrate including an amplification transistor that generates a signal of a voltage corresponding to a level of charges obtained at each photoelectric conversion section are stacked on each other.

CITATION LIST

Patent Literature

PTL 1: Japanese Unexamined Patent Application Publication No. 2010-245506

SUMMARY OF THE INVENTION

However, in a case of coupling a lower semiconductor substrate and an upper semiconductor substrate together using a wiring line, the length of the wiring line becomes longer, and increased parasitic capacitance may possibly deteriorate efficient conversion. This is an issue that may occur not only in imaging elements but also in semiconductor elements as a whole. It is therefore desirable to provide an imaging element and a semiconductor element that make it possible to suppress a decrease in efficient conversion.

An imaging element according to an embodiment of the present disclosure includes a first semiconductor substrate, and a second semiconductor substrate stacked over the first semiconductor substrate with an insulating layer interposed therebetween. The first semiconductor substrate includes a photoelectric conversion section, and a charge-holding section that holds charges transferred from the photoelectric conversion section. The second semiconductor substrate includes an amplification transistor that generates a signal of a voltage corresponding to a level of charges held in the charge-holding section. The amplification transistor includes a channel region, a source region, and a drain region in a plane intersecting a front surface of the second semiconductor substrate, and includes a gate electrode that is opposed to the channel region with a gate insulating film interposed therebetween and is electrically coupled to the charge-holding section.

In the imaging element according to an embodiment of the present disclosure, there is provided the amplification transistor that includes the channel region, the source region, and the drain region in a plane intersecting the front surface of the second semiconductor substrate, and includes the gate electrode being opposed to the channel region with the gate insulating film interposed therebetween and being electrically coupled to the charge-holding section. This makes it possible to shorten the length of a wiring line coupling the amplification transistor and the charge-holding section together and thus to reduce parasitic capacitance.

A semiconductor element according to an embodiment of the present disclosure includes a first semiconductor substrate including a first transistor or a photoelectric conversion section; and a second semiconductor substrate that is stacked over the first semiconductor substrate with an insulating layer interposed therebetween and includes a second transistor. The second transistor includes a channel region, a source region, and a drain region in a plane intersecting a front surface of the second semiconductor substrate, and includes a gate electrode that is opposed to the channel region with a gate insulating film interposed therebetween and is electrically coupled to the first semiconductor substrate.

In the semiconductor element according to an embodiment of the present disclosure, there is provided the amplification transistor that includes the channel region, the source region, and the drain region in a plane intersecting the front surface of the second semiconductor substrate, and includes the gate electrode being opposed to the channel region with the gate insulating film interposed therebetween and being electrically coupled to the charge-holding section. This makes it possible to shorten the length of a wiring line coupling the second transistor and the first semiconductor substrate together and thus to reduce parasitic capacitance.

MODES FOR CARRYING OUT THE
INVENTION

Hereinafter, description is given in detail of embodiments of the present disclosure with reference to the drawings. It is to be noted that the description is given in the following order.

1. Embodiment (Imaging Element)

An example in which a gate of AMP is formed in a vertical plane (FIGS. 1 to 5)

2. Modification Examples (Imaging Element)

Figure 6:
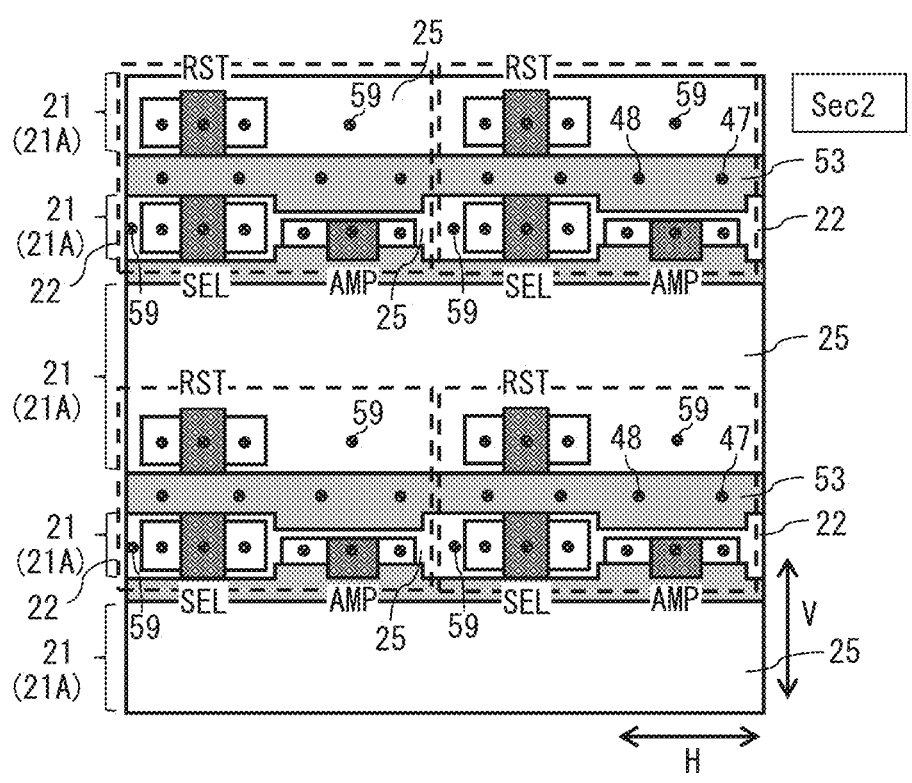
FIG. 6 illustrates a modification example of the cross-sectional configuration along Sec2 of FIG. 4.

Modification Example A: An example of four-terminal structure (FIG. 6)

Figure 7:
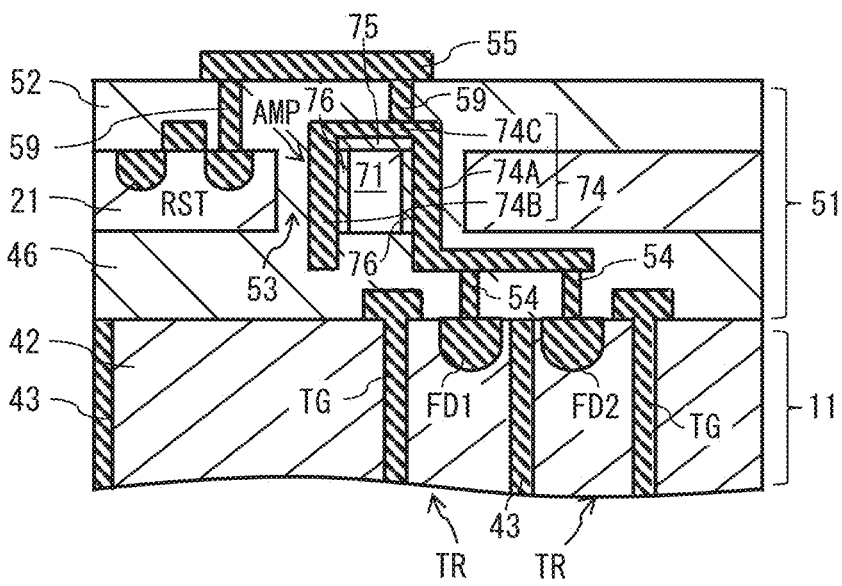
FIG. 7 illustrates a modification example of the cross-sectional configuration of FIG. 4.
Figure 8:
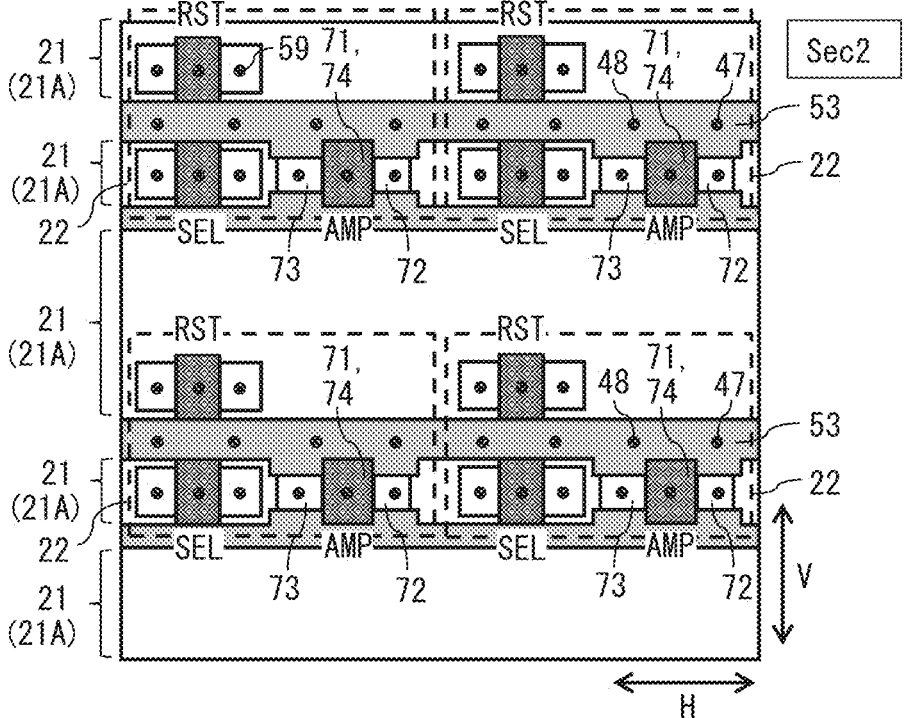
FIG. 8 illustrates a modification example of the cross-sectional configuration along Sec2 of FIG. 4.
Figure 9:
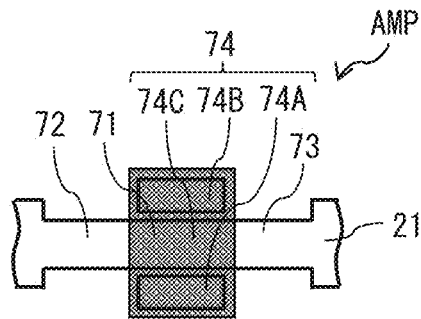
FIG. 9 illustrates a planar configuration example of an AMP of each of FIGS. 7 and 8.

Modification Example B: An example of double-gate structure (FIGS. 7 to 9)

Figure 10:
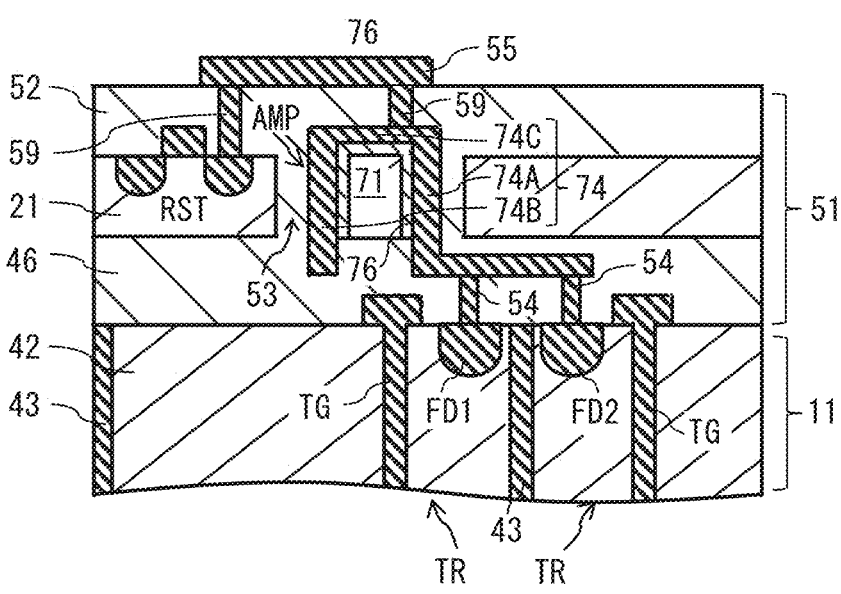
FIG. 10 illustrates a modification example of the cross-sectional configuration of FIG. 4.

Modification Example C: An example of tri-gate structure (FIG. 10)

Modification Example D: An example in which gates of RST and SEL are also formed in the vertical plane (FIGS. 11 to 15).

Modification Example E: An example in which FDG is formed (FIGS. 16 to 21)

Figure 22:
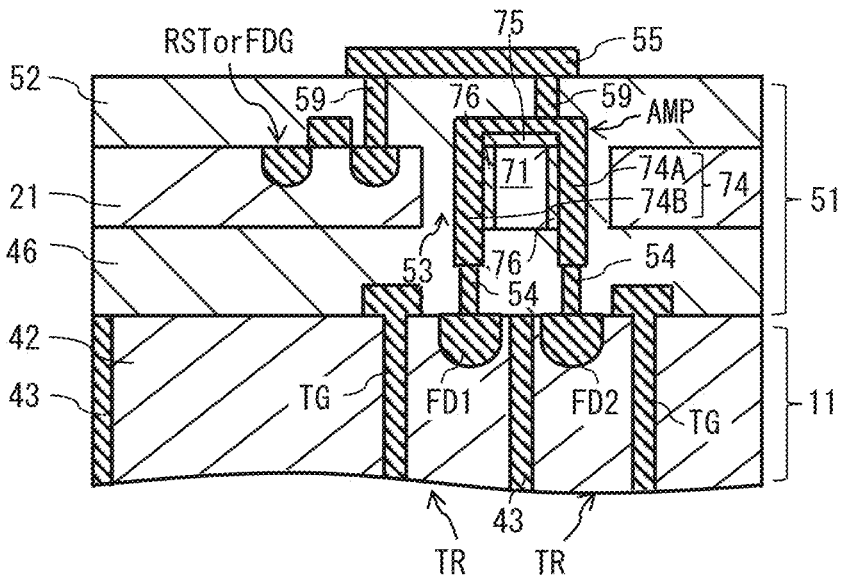
FIG. 22 illustrates a modification example of the cross-sectional configuration of FIG. 4.
Figure 23:
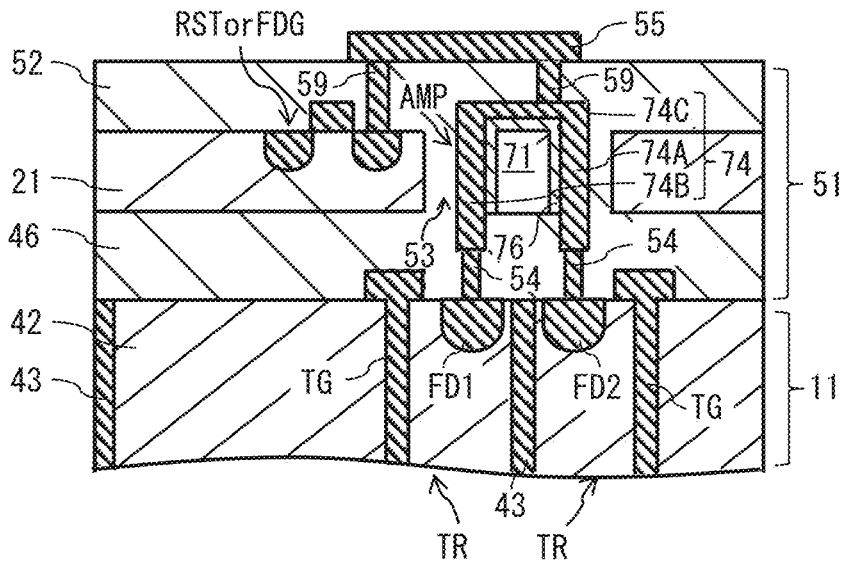
FIG. 23 illustrates a modification example of the cross-sectional configuration of FIG. 4.
Figure 24:
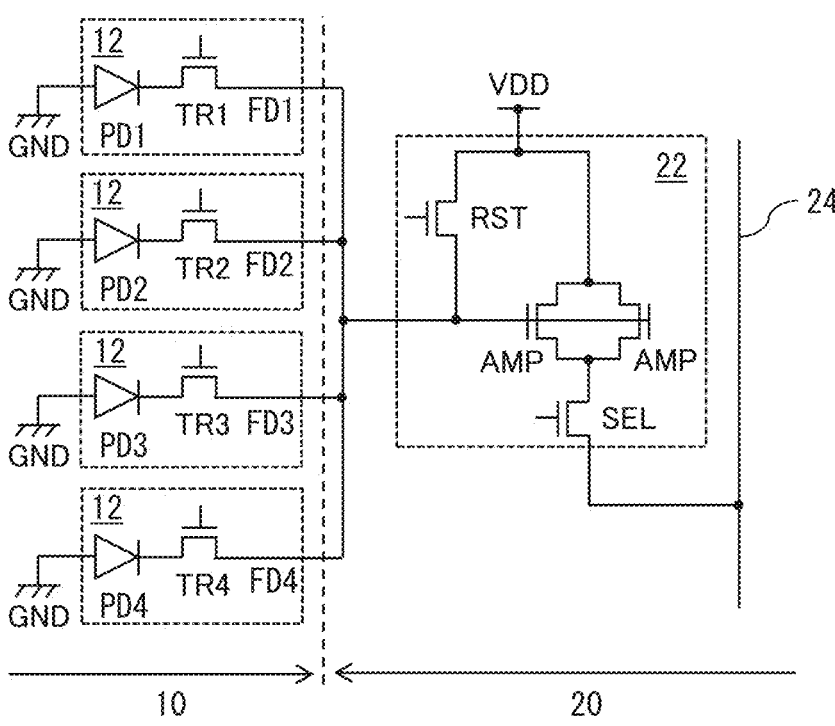
FIG. 24 illustrates a modification example of the circuit configuration of the sensor pixel and the readout circuit of FIG. 1.
Figure 25:
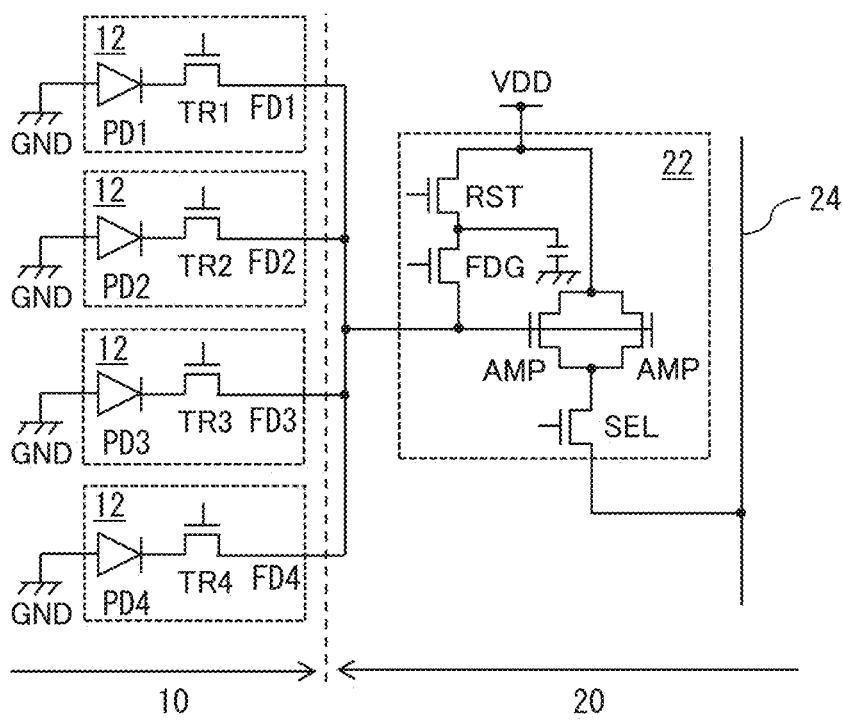
FIG. 25 illustrates a modification example of the circuit configuration of the sensor pixel and the readout circuit of FIG. 1.

Modification Example F: An example in which AMP is formed over an element separation section (FIGS. 22 and 23)

Modification Example G: An example in which a plurality of AMPs are coupled in parallel, and FDs and the AMPs are coupled via a coupling pad (FIGS. 24 to 32)

Modification Example H: An example in which FD is shared (FIGS. 33 to 38)

Modification Example I: An example in which a gate of AMP is directly coupled to FD (FIGS. 39 to 42)

Figure 43:
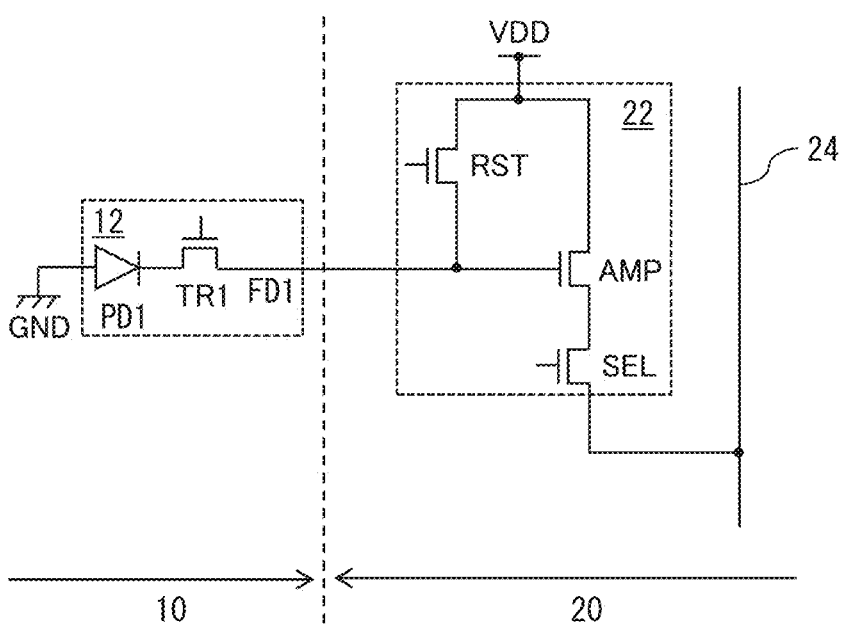
FIG. 43 illustrates a modification example of the circuit configuration of FIG. 2.
Figure 44:
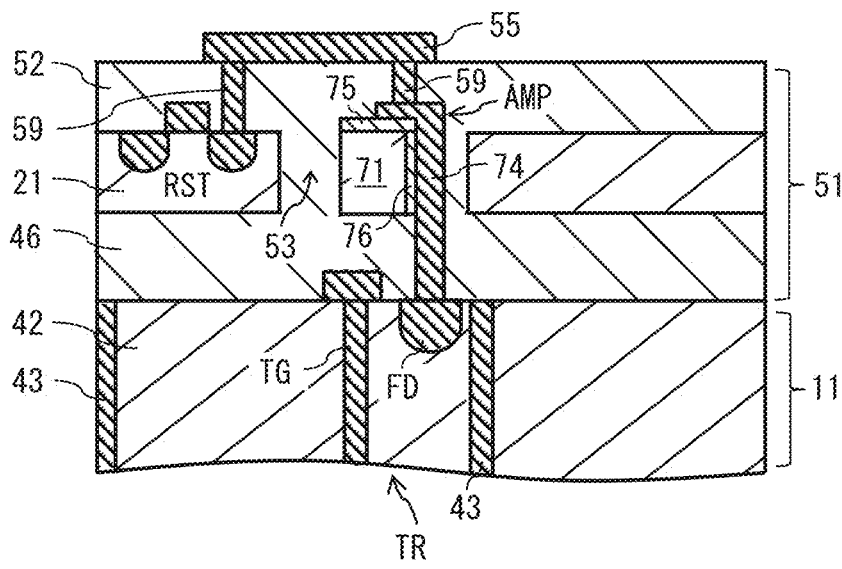
FIG. 44 illustrates a modification example of a cross-sectional configuration of a sensor pixel having the circuit configuration of FIG. 43.

Modification Example J: An example in which readout circuits are provided one by one for respective sensor pixels (FIGS. 43 and 44)

3. Application Example

Figure 45:
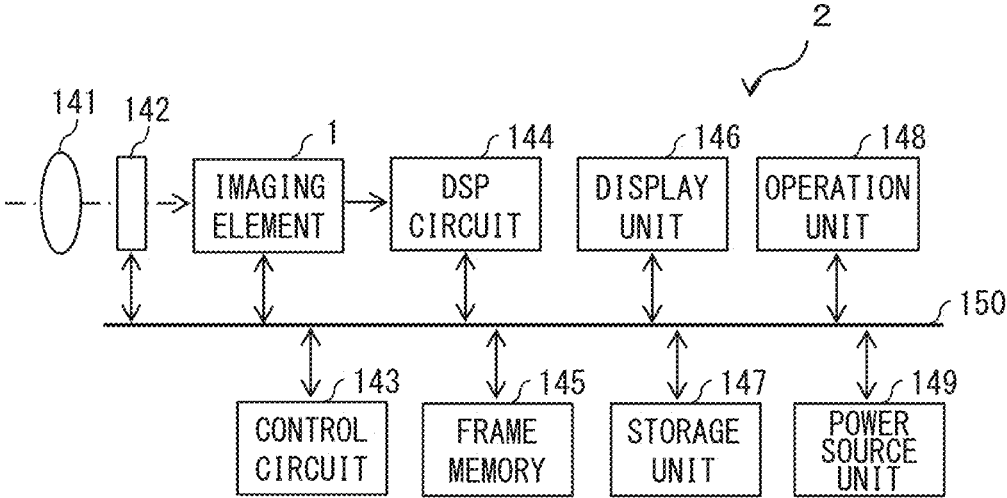
FIG. 45 illustrates an example of a schematic configuration of an imaging system including the imaging element according to any of the foregoing embodiment and modification examples thereof.
Figure 46:
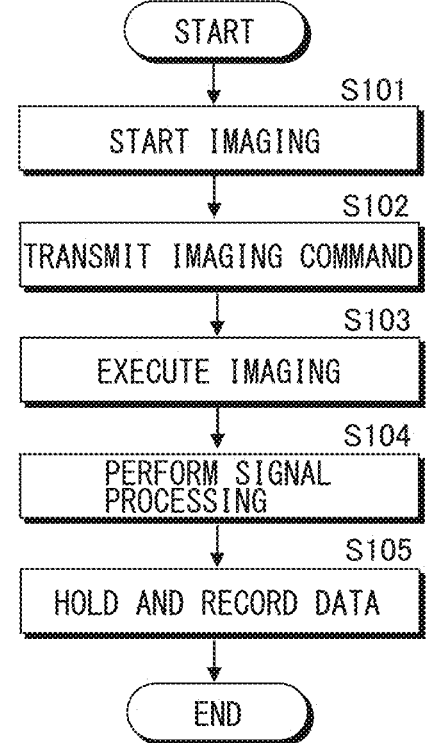
FIG. 46 illustrates an example of an imaging procedure in the imaging system of FIG. 45.

An example in which the imaging element according to the foregoing embodiment and modification examples thereof is applied to an imaging system (FIGS. 45 and 46)

4. Practical Application Examples

Figure 47:
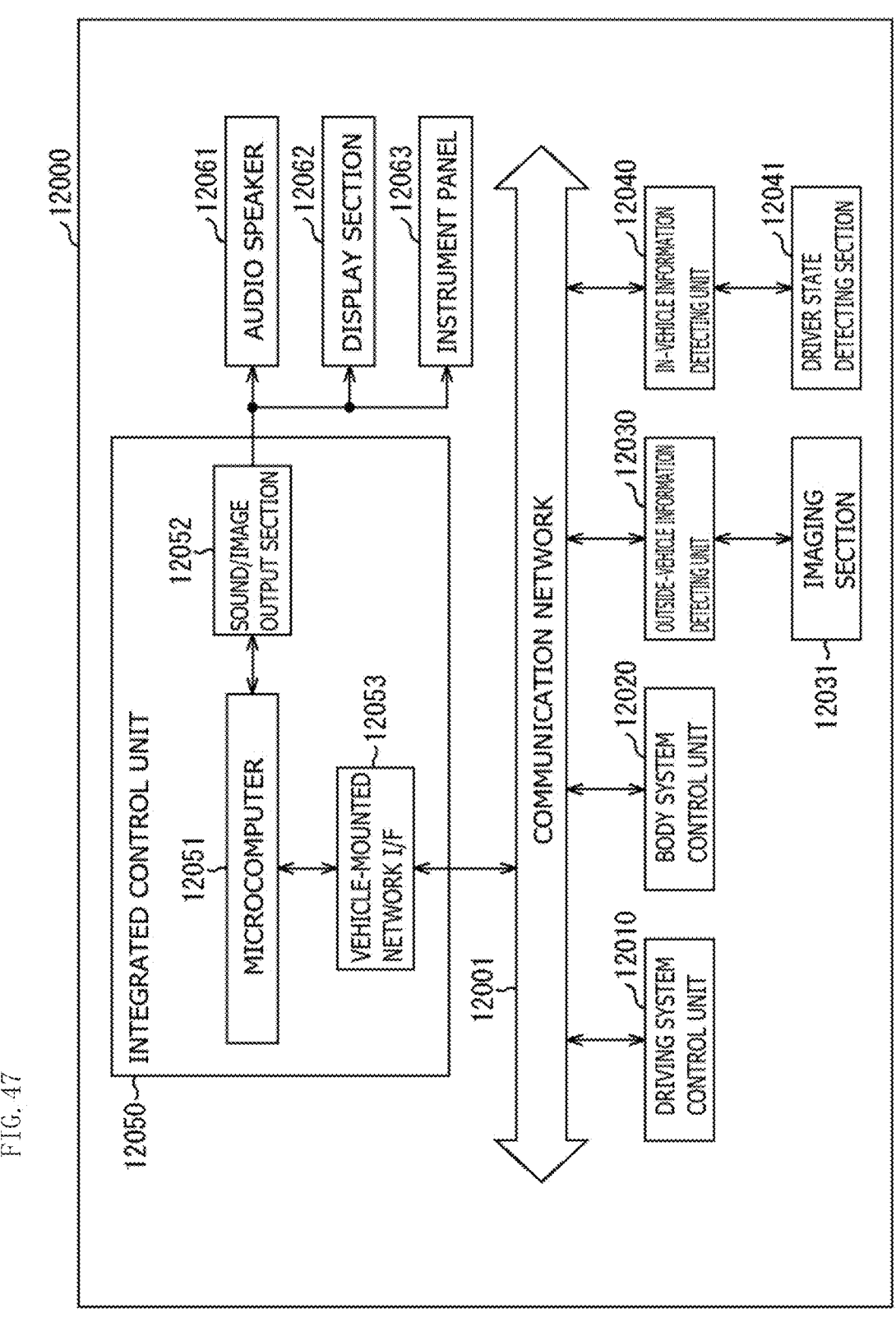
FIG. 47 is a block diagram depicting an example of schematic configuration of a vehicle control system.
Figure 48:
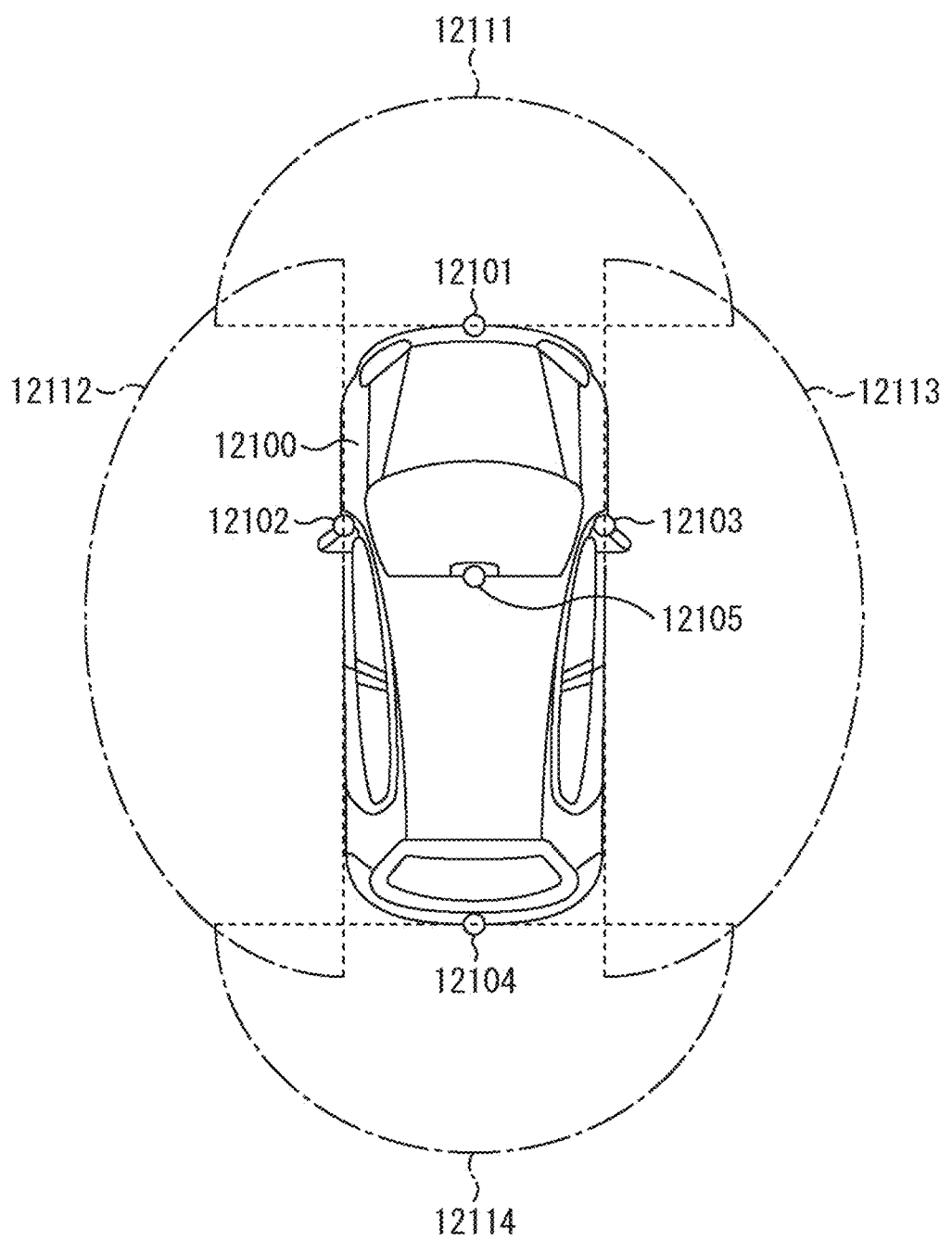
FIG. 48 is a diagram of assistance in explaining an example of installation positions of an outside-vehicle information detecting section and an imaging section.

Practical Application Example 1 . . . An example in which the imaging element according to the foregoing embodiment and modification examples thereof is applied to a mobile body (FIGS. 47 and 48)

Figure 49:
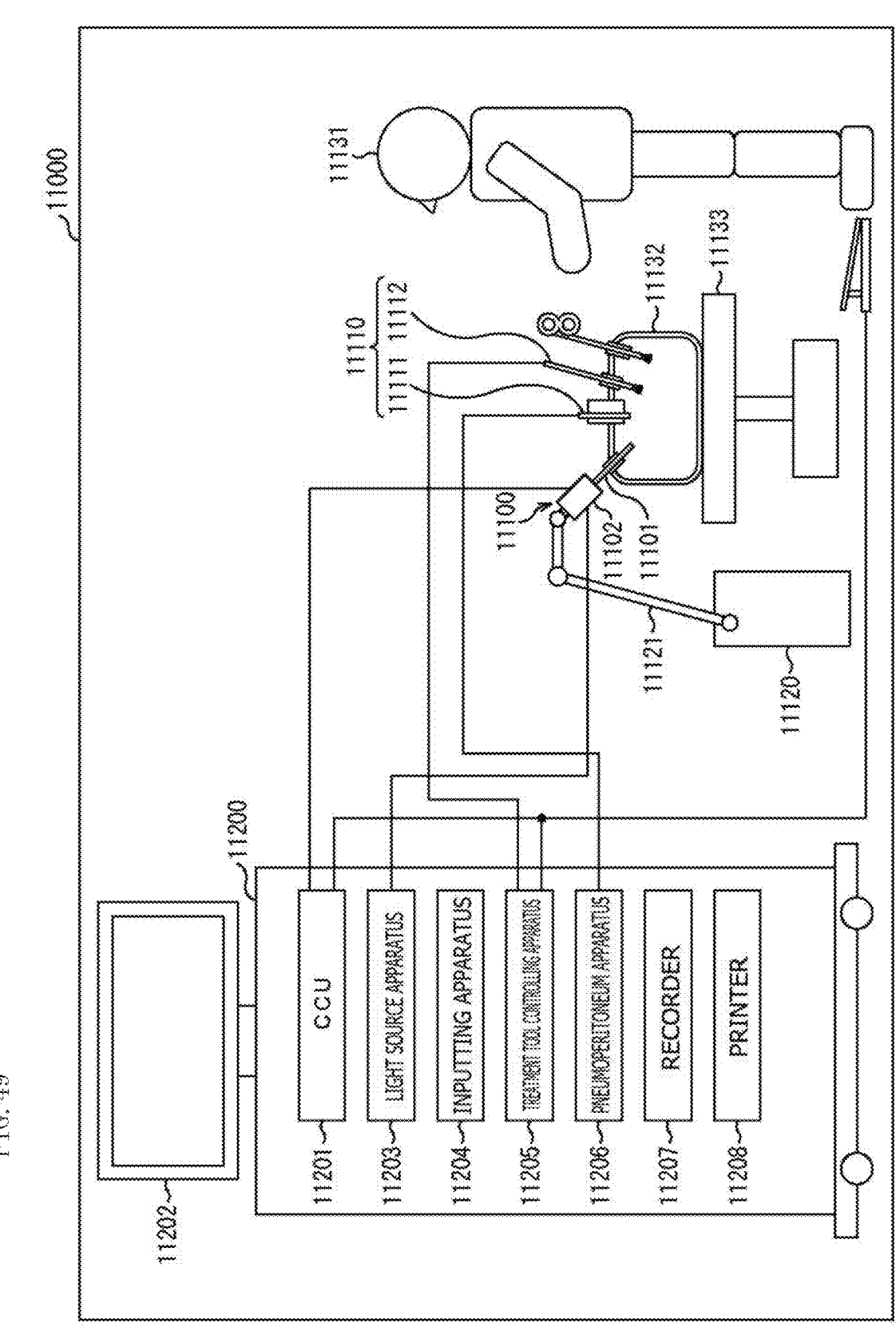
FIG. 49 is a view depicting an example of a schematic configuration of an endoscopic surgery system.
Figure 50:
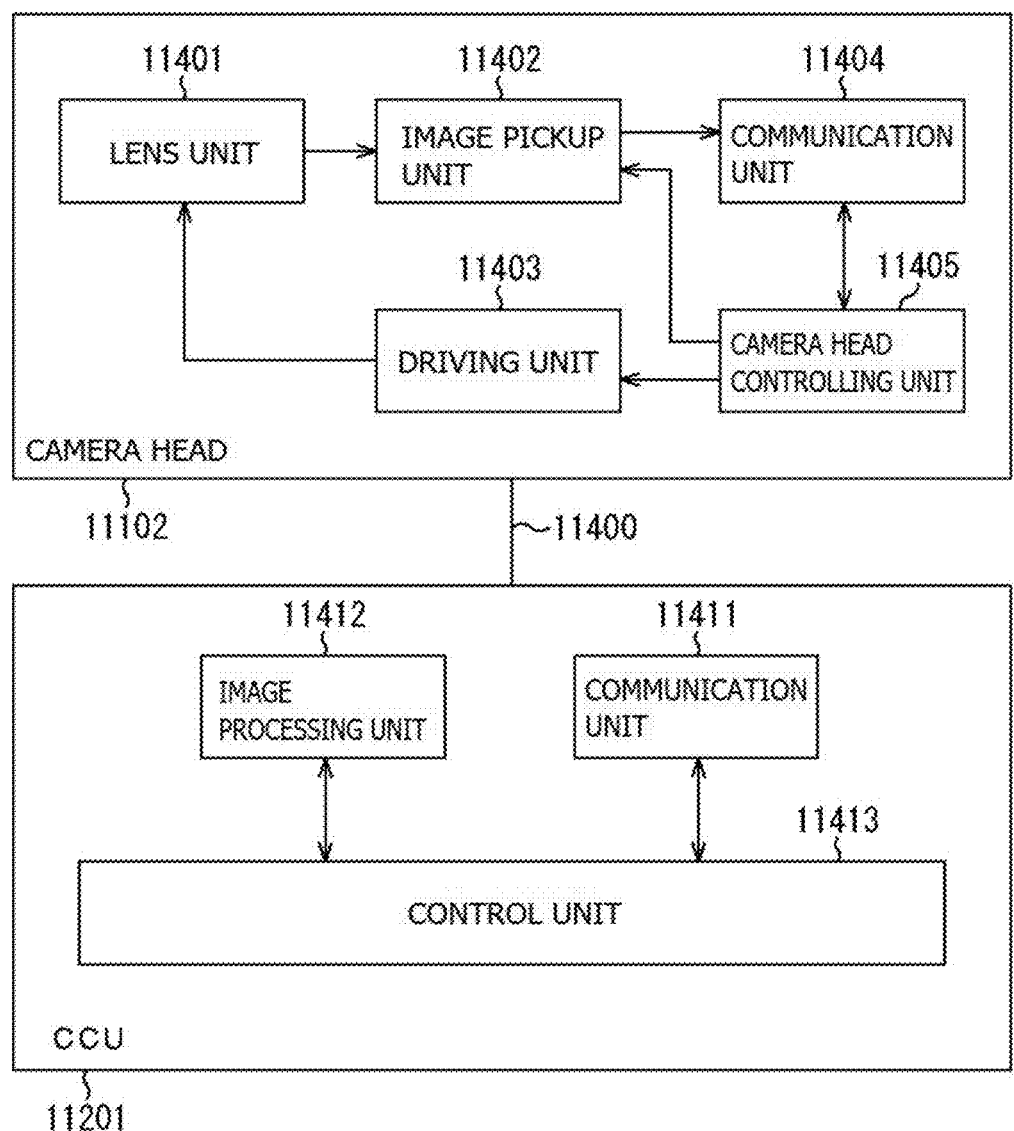
FIG. 50 is a block diagram depicting an example of a functional configuration of a camera head and a camera control unit (CCU).

Practical Application Example 2 . . . An example in which the imaging element according to the foregoing embodiment and modification examples thereof is applied to a surgery system (FIGS. 49 and 50)

5. Other Application Examples

Figure 51:
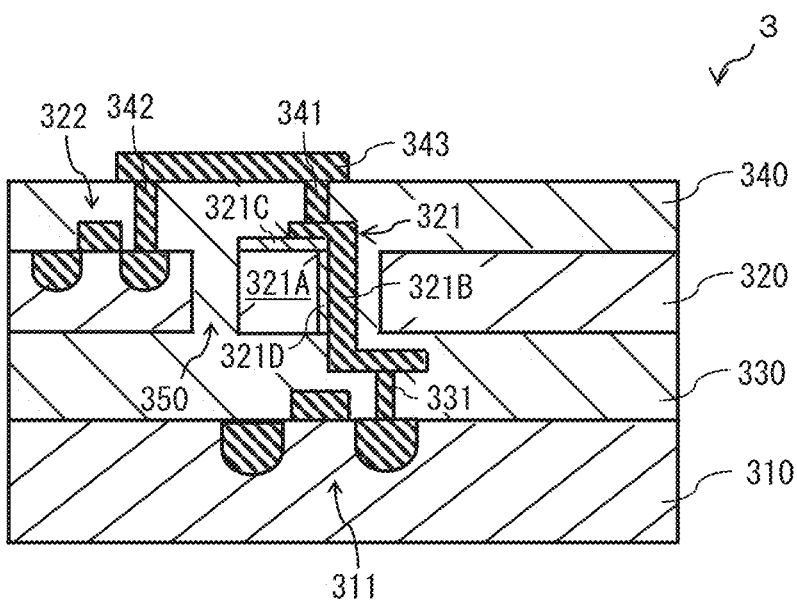
FIG. 51 illustrates an example in which the configuration of the imaging element of the foregoing embodiment, etc. is applied to a semiconductor element.
Figure 52:
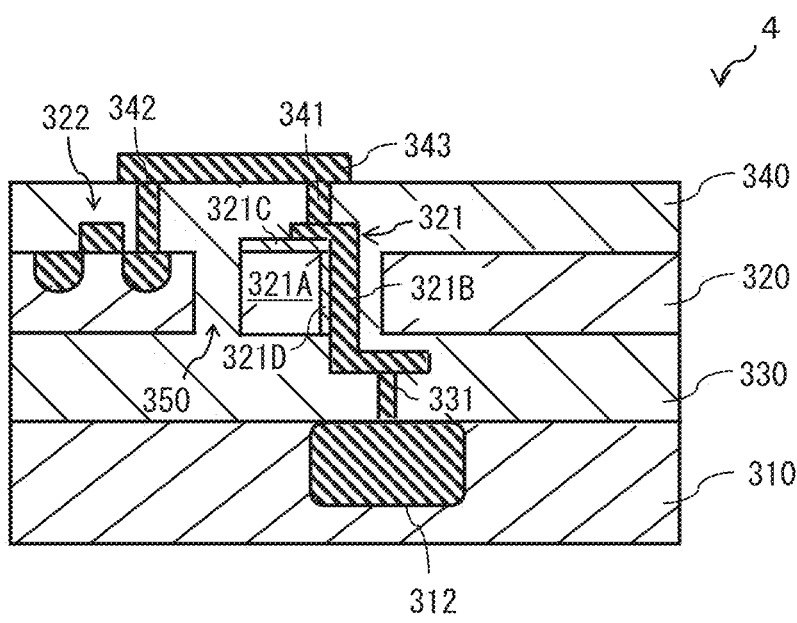
FIG. 52 illustrates an example in which the configuration of the imaging element of the foregoing embodiment, etc. is applied to a semiconductor element.

Examples in which the configuration of the imaging element of the foregoing embodiment, etc. is applied to a semiconductor element (FIGS. 51 and 52)

1. EMBODIMENT

Configuration

Description is given of an imaging element 1 according to an embodiment of the present disclosure. The imaging element 1 is, for example, a backside illumination type image sensor including a CMOS (Complementary Metal Oxide Semiconductor) image sensor, or the like. The imaging element 1 receives light from a subject and performs photoelectric conversion to generate an image signal, thereby capturing an image. The imaging element 1 outputs a pixel signal corresponding to incident light.

The backside illumination type image sensor refers to an image sensor of a configuration in which a photoelectric conversion section such as a photodiode that receives light from a subject and converts the received light into an electric signal is provided between a light-receiving surface on which light from the subject is incident and a wiring layer in which a wiring line such as a transistor that drives each pixel is provided. It is to be noted that the present disclosure is not limited to the application to the CMOS image sensor.

Figure 1:
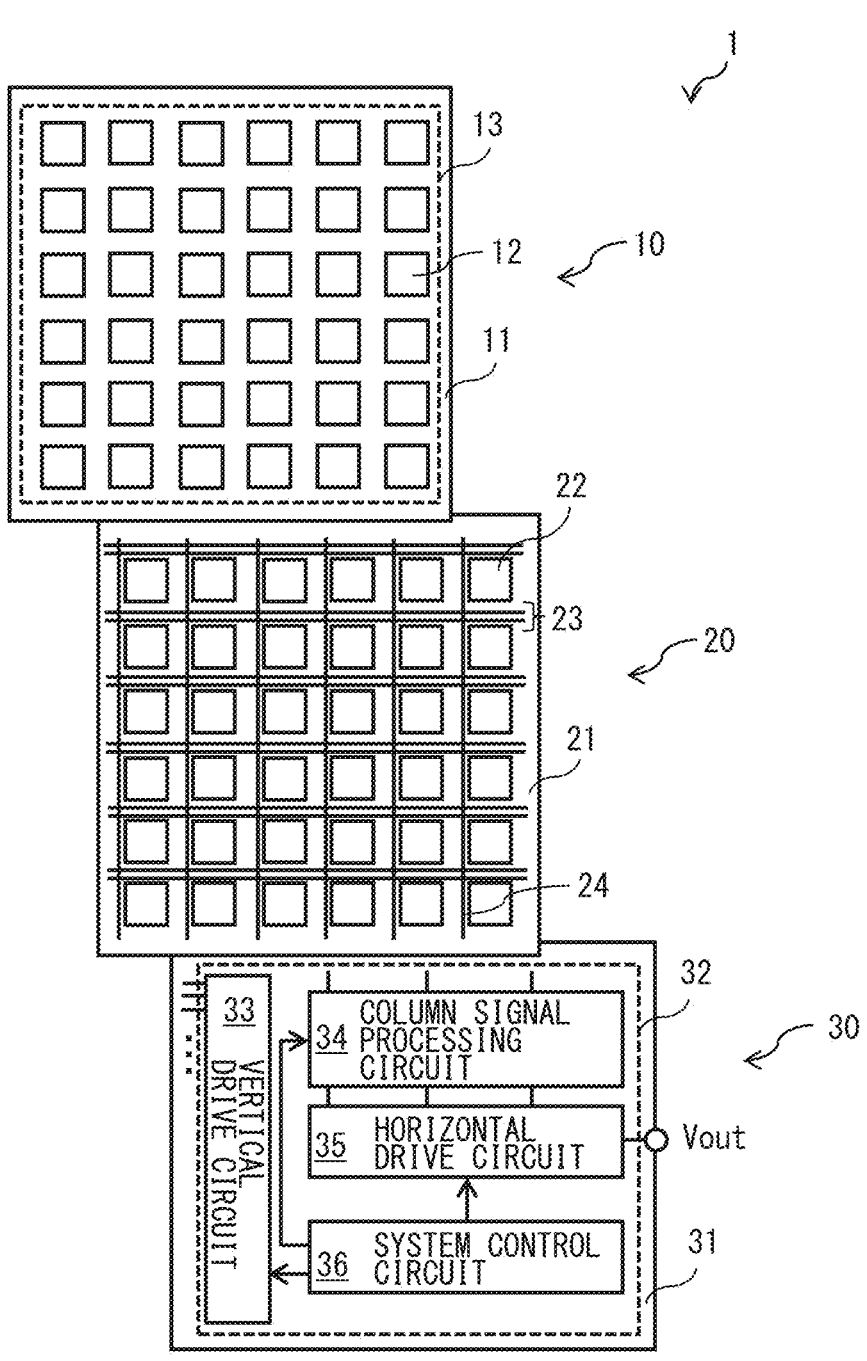
FIG. 1 illustrates an example of a schematic configuration of an imaging element according to an embodiment of the present disclosure.

FIG. 1 illustrates an example of a schematic configuration of the imaging element 1 according to an embodiment of the present disclosure. The imaging element 1 includes three substrates (a first substrate 10, a second substrate 20, and a third substrate 30). The imaging element 1 is a three-dimensionally structured imaging device in which the three substrates (the first substrate 10, the second substrate 20, and the third substrate 30) are attached together. The first substrate 10, the second substrate 20, and the third substrate 30 are stacked in this order.

The first substrate 10 includes a pixel region 13 in which a plurality of sensor pixels 12 that perform photoelectric conversion are arranged in matrix. The pixel region 13 is formed on a semiconductor substrate 11. The second substrate 20 includes a plurality of readout circuits 22 that output pixel signals based on charges outputted from the sensor pixels 12. The plurality of readout circuits 22 are formed on a semiconductor substrate 21, and one readout circuit 22 is assigned for one sensor pixel 12, for example. The second substrate 20 includes a plurality of pixel drive lines 23 extending in a row direction and a plurality of vertical signal lines 24 extending in a column direction. The third substrate 30 includes a logic circuit 32 that processes the pixel signal. The logic circuit 32 is formed on a semiconductor substrate 31. The logic circuit 32 includes, for example, a vertical drive circuit 33, a column signal processing circuit 34, a horizontal drive circuit 35, and a system control circuit 36. The logic circuit 32 (specifically, the horizontal drive circuit 35) outputs an output-voltage Vout for each sensor pixel 12 to the outside.

The vertical drive circuit 33 sequentially selects, for example, the plurality of sensor pixels 12 in a unit of row. The column signal processing circuit 34 performs, for example, correlated double sampling (Correlated Double Sampling: CDS) processing on a pixel signal outputted from each sensor pixel 12 of a row selected by the vertical drive circuit 33. The column signal processing circuit 34 performs, for example, the CDS processing to thereby extract a signal level of the pixel signal and to hold pixel data corresponding to an amount of light reception of each sensor pixel 12. The horizontal drive circuit 35 sequentially outputs, for example, the pixel data held in the column signal processing circuit 34 to the outside. The system control circuit 36 controls, for example, driving of each of the blocks (the vertical drive circuit 33, the column signal processing circuit 34, and the horizontal drive circuit 35) inside the logic circuit 32.

Figure 2:
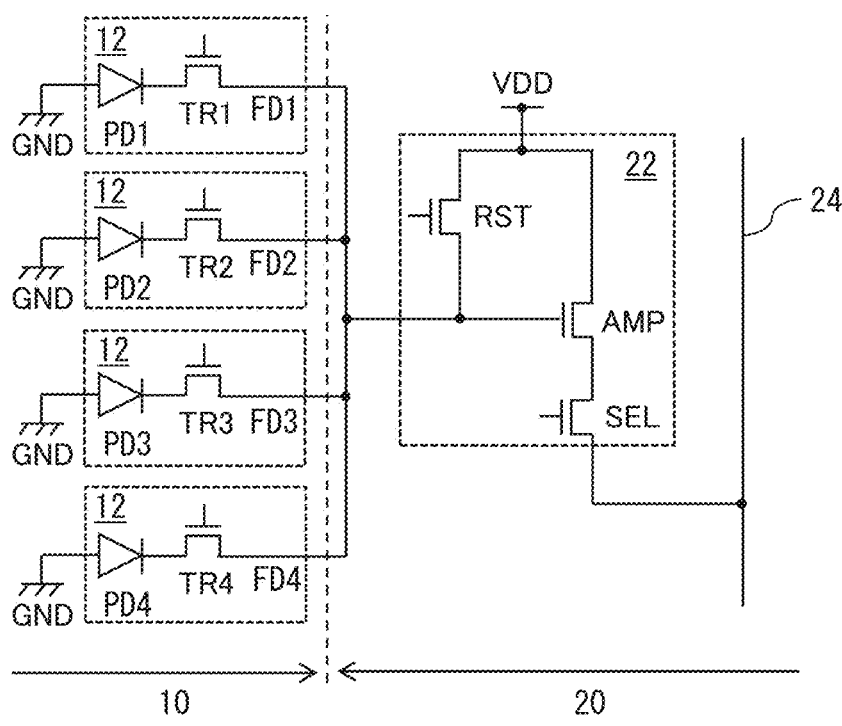
FIG. 2 illustrates an example of a circuit configuration of a sensor pixel and a readout circuit of FIG. 1.

FIG. 2 illustrates an example of the sensor pixel 12 and the readout circuit 22.

Hereinafter, description is given of a case where four sensor pixels 12 share one readout circuit 22 as illustrated in FIG. 2. Here, the term "share" refers to outputs of the four sensor pixels 12 being inputted to the common readout circuit 22.

Each of the sensor pixels 12 has mutually common components. In FIG. 2, identification numbers (1, 2, 3, and 4) are assigned to the ends of symbols of components of the respective sensor pixels 12, in order to distinguish the components of the respective sensor pixels 12 from one another. Hereinafter, in a case where the components of the respective sensor pixels 12 need to be distinguished from one another, the identification numbers are assigned to the ends of the symbols of the components of the respective sensor pixels 12; whereas, in a case where the components of the respective sensor pixels 12 need not be distinguished from one another, the identification numbers at the ends of the symbols of the components of the respective sensor pixels 12 are omitted.

Each of the sensor pixels 12 includes, for example, a photodiode PD, a transfer transistor TR electrically coupled to the photodiode PD, and a floating diffusion FD that temporarily holds charges transferred from the photodiode PD via the transfer transistor TR. The photodiode PD corresponds to a specific example of a "photoelectric conversion section" of the present disclosure. The photodiode PD performs photoelectric conversion to generate charges corresponding to an amount of light reception. A cathode of the photodiode PD is electrically coupled to a source of the transfer transistor TR, and an anode of the photodiode PD is electrically coupled to a reference potential line (e.g., ground). A drain of the transfer transistor TR is electrically coupled to the floating diffusion FD, and a gate of the transfer transistor TR is electrically coupled to the pixel drive line 23. The transfer transistor TR is, for example, the CMOS (Complementary Metal Oxide Semiconductor) transistor.

The floating diffusions FD of the respective sensor pixels 12 sharing one readout circuit 22 are electrically coupled to one another, and are electrically coupled to an input end of the common readout circuit 22. The readout circuit 22 includes, for example, a reset transistor RST, a selection transistor SEL, and an amplification transistor AMP. It is to be noted that the selection transistor SEL may be omitted as necessary. A source of the reset transistor RST (an input end of the readout circuit 22) is electrically coupled to the floating diffusion FD, and a drain of the reset transistor RST is electrically coupled to a power source line VDD and a drain of the amplification transistor AMP. A gate of the reset transistor RST is electrically coupled to the pixel drive line 23 (see FIG. 1). A source of the amplification transistor AMP is electrically coupled to a drain of the selection transistor SEL, and a gate of the amplification transistor AMP is electrically coupled to the source of the reset transistor RST. A source of the selection transistor SEL (an output end of the readout circuit 22) is electrically coupled to the vertical signal line 24, and a gate of the selection transistor SEL is electrically coupled to the pixel drive line 23 (see FIG. 1).

Figure 3:
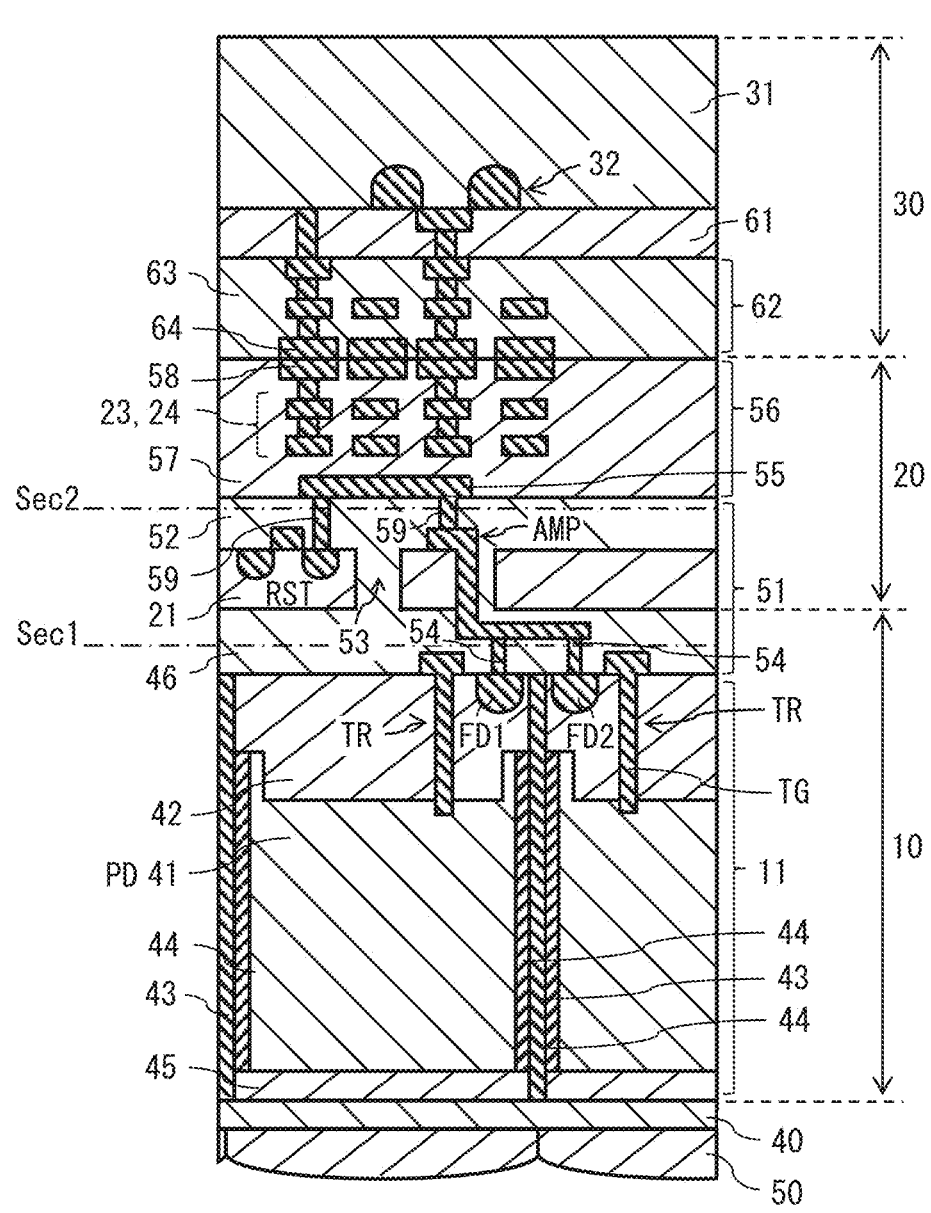
FIG. 3 illustrates an example of a cross-sectional configuration of the sensor pixel of FIG. 1.

When the transfer transistor TR is brought into an ON state, the transfer transistor TR transfers charges of the photodiode PD to the floating diffusion FD. The gate (a transfer gate TG) of the transfer transistor TR extends to penetrate a p-well layer 42 from a front surface of the semiconductor substrate 11 to such a depth as to reach a PD 41, for example, as illustrated in FIG. 3 described later. The reset transistor RST resets an electric potential of the floating diffusion FD to a predetermined electric potential. When the reset transistor RST is brought into an ON state, the electric potential of the floating diffusion FD is reset to an electric potential of the power source line VDD. The selection transistor SEL controls an output timing of a pixel signal from the readout circuit 22. The amplification transistor AMP generates, as the pixel signal, a signal of a voltage corresponding to a level of charges held in the floating diffusion FD. The amplification transistor AMP configures a source-follower type amplifier, and output a pixel signal of a voltage corresponding to a level of charges generated in the photodiode PD. When the selection transistor SEL is brought into an ON state, the amplification transistor AMP amplifies the electric potential of the floating diffusion FD, and outputs a voltage corresponding to the electric potential to the column signal processing circuit 34 via the vertical signal line 24. The reset transistor RST, the amplification transistor AMP, and the selection transistor SEL are each, for example, the CMOS transistor.

It is to be noted that the selection transistor SEL may be provided between the power source line VDD and the amplification transistor AMP. In this case, the drain of the reset transistor RST is electrically coupled to the power source line VDD and the drain of the selection transistor SEL. The source of the selection transistor SEL is electrically coupled to the drain of the amplification transistor AMP, and the gate of the selection transistor SEL is electrically coupled to the pixel drive line 23 (see FIG. 1). The source of the amplification transistor AMP (output end of the readout circuit 22) is electrically coupled to the vertical signal line 24, and the gate of the amplification transistor AMP is electrically coupled to the source of the reset transistor RST.

Figure 4:
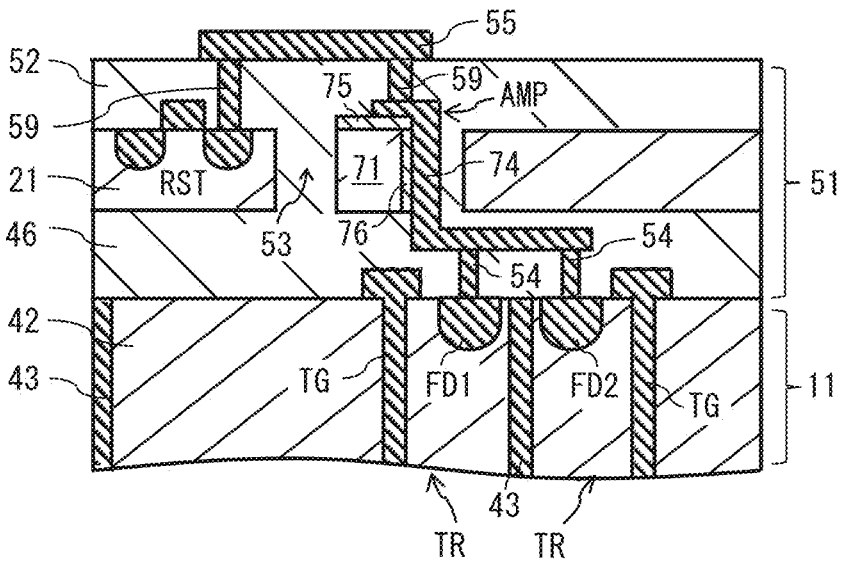
FIG. 4 is an enlarged view of a portion of the cross-sectional configuration of FIG. 3.

FIG. 3 illustrates an example of a cross-sectional configuration in a vertical direction of the imaging element 1. FIG. 3 exemplifies a cross-sectional configuration of a location, of the imaging element 1, facing the sensor pixel 12. FIG. 4 is an enlarged view of a location of coupling between the first substrate 10 and the second substrate 20 in the imaging element 1. The imaging element 1 has a configuration in which the first substrate 10, the second substrate 20, and the third substrate 30 are stacked in this order, and further includes, on side of a back surface (light incident surface side) of the first substrate 10, a color filter 40 and a light-receiving lens 50. One color filter 40 and one light-receiving lens 50 are each provided for each sensor pixel 12, for example. That is, the imaging element 1 is an imaging device of a backside illumination type.

The first substrate 10 has a configuration in which an insulating layer 46 is stacked on the semiconductor substrate 11. The insulating layer 46 corresponds to a specific example of an "insulating layer" of the present disclosure. The insulating layer 46 is configured by an inorganic insulating material such as $SiO_2$ or SiN, for example. The first substrate 10 includes, as a portion of an interlayer insulating film 51, the insulating layer 46. The insulating layer 46 is provided in a gap between the semiconductor substrate 11 and the semiconductor substrate 21 described later. That is, the semiconductor substrate 21 is stacked over the semiconductor substrate 11 with the insulating layer 46 interposed therebetween. The semiconductor substrate 11 is configured by a silicon substrate. The semiconductor substrate 11 includes, for example, the p-well layer 42 at a portion of the front surface and a vicinity thereof, and includes the PD 41 of an electric conductivity type different from that of the p-well layer 42 at a region other than those (a deeper region than the p-well layer 42). The p-well layer 42 is configured by a p-type semiconductor region. The PD 41 is configured by a semiconductor region of an electric conductivity type different from that of the p-well layer 42 (specifically, n-type). The semiconductor substrate 11 includes, inside the p-well layer 42, the floating diffusion FD, as a semiconductor region of an electric conductivity type different from that of the p-well layer 42 (specifically, n-type).

The first substrate 10 (semiconductor substrate 11) includes the photodiode PD, the transfer transistor TR, and the floating diffusion FD for each sensor pixel 12. The first substrate 10 has a configuration in which the transfer transistor TR and the floating diffusion FD are provided at a part of the semiconductor substrate 11 on side of the front surface (on side opposite to the light incident surface; on side of the second substrate 20). The first substrate 10 (semiconductor substrate 11) includes an element separation section 43 that separates the sensor pixels 12 from each other. The element separation section 43 is formed to extend in a normal direction (a direction perpendicular to the front surface of the semiconductor substrate 11) of the semiconductor substrate 11. The element separation section 43 is provided between two sensor pixels 12 adjacent to each other. The element separation section 43 electrically separates the adjacent sensor pixels 12 from each other. The element separation section 43 is configured by, for example, silicon oxide. The element separation section 43 penetrates the semiconductor substrate 11, for example.

The first substrate 10 further includes, for example, a p-well layer 44 in contact with a surface, being a side surface of the element separation section 43, on side of the photodiode PD. The p-well layer 44 is configured by a semiconductor region of an electric conductivity type (specifically, p-type) different from that of the photodiode PD. The first substrate 10 further includes, for example, a fixed-charge film 45 in contact with a back surface of the semiconductor substrate 11. In order to suppress occurrence of a dark current due to an interface state of the semiconductor substrate 11 on side of a light-receiving surface, the fixed-charge film 45 is negatively charged. The fixed-charge film 45 is formed by, for example, an insulating film having negative fixed charges. Examples of a material of such an insulating film include hafnium oxide, zirconium oxide, aluminum oxide, titanium oxide, and tantalum oxide. An electric field induced by the fixed-charge film 45 forms a hole accumulation layer at an interface on the side of the light-receiving surface of the semiconductor substrate 11. This hole accumulation layer suppresses generation of electrons from the interface. The color filter 40 is provided on side of the back surface of the semiconductor substrate 11. The color filter 40 is formed in contact with the fixed-charge film 45, for example, and is provided at a position opposed to the sensor pixel 12 with the fixed-charge film 45 interposed therebetween. The light-receiving lens 50 is provided in contact with the color filter 40, for example, and is provided at a position opposed to the sensor pixel 12, with the color filter 40 and the fixed-charge film 45 interposed therebetween.

The second substrate 20 has a configuration in which an insulating layer 52 is stacked on the semiconductor substrate 21. The insulating layer 52 is configured by an inorganic insulating material such as $SiO_2$ or SiN, for example. The second substrate 20 includes, as a portion of the interlayer insulating film 51, the insulating layer 52. The insulating layer 52 is provided in a gap between the semiconductor substrate 21 and the semiconductor substrate 31. The semiconductor substrate 21 is configured by a silicon substrate. The second substrate 20 (semiconductor substrate 21) includes one readout circuit 22 for every four sensor pixels 12. The second substrate 20 has a configuration in which the readout circuit 22 is provided at a part of the semiconductor substrate 21 on side of the front surface (on side of the third substrate 30). The second substrate 20 is attached to the first substrate 10, with a back surface of the semiconductor substrate 21 being opposed to the side of the front surface of the semiconductor substrate 11. The second substrate 20 further includes an insulating layer 53 that penetrates the semiconductor substrate 21, in the same layer as the semiconductor substrate 21. The insulating layer 53 is configured by an inorganic insulating material such as $SiO_2$ or SiN, for example. The second substrate 20 includes, as a portion of the interlayer insulating film 51, the insulating layer 53. The insulating layer 53 is provided to cover a side surface of the amplification transistor AMP, side surfaces of through-wiring lines 47 and 48 described later, and the like.

A stacked body including the first substrate 10 and the second substrate 20 includes the interlayer insulating film 51 and a plurality of coupling sections 54 provided inside the interlayer insulating film 51. The stacked body includes one coupling section 54 for each sensor pixel 12. The coupling section 54 extends in a normal direction of the semiconductor substrate 21. The first substrate 10 and the second substrate 20 are electrically coupled to each other by the plurality of coupling sections 54. Specifically, the coupling section 54 is linked to the floating diffusion FD and a lower end of a gate electrode 74 (described later) of the amplification transistor AMP, and is electrically coupled to the corresponding floating diffusion FD and the gate electrode 74 of the amplification transistor AMP.

The stacked body including the first substrate 10 and the second substrate 20 further includes through-wiring lines 47 and 48 (see FIG. 5 described later) provided inside the interlayer insulating film 51. The above stacked body includes one through-wiring line 47 and one through-wiring line 48 for each sensor pixel 12. The through-wiring lines 47 and 48 each extend in the normal direction of the semiconductor substrate 21, and is provided to penetrate a location, of the interlayer insulating film 51, including the insulating layer 53. The first substrate 10 and the second substrate 20 are electrically coupled to each other by the through-wiring lines 47 and 48. Specifically, the through-wiring line 47 is electrically coupled to the p-well layer 42 of the semiconductor substrate 11 and to a wiring line inside the second substrate 20. The through-wiring line 48 is electrically coupled to the transfer gate TG and to the pixel drive line 23.

The second substrate 20 includes, for example, inside the insulating layer 52, a plurality of coupling sections 59 electrically coupled to the readout circuit 22 and the semiconductor substrate 21. The second substrate 20 further includes, for example, a wiring layer 56 on the insulating layer 52. The wiring layer 56 includes, for example, an insulating layer 57, and the plurality of pixel drive lines 23 and the plurality of vertical signal lines 24 provided inside the insulating layer 57. The wiring layer 56 further includes, inside the insulating layer 57, for example, a plurality of coupling wiring lines 55 provided one by one for the respective readout circuits 22. The coupling wiring line 55 electrically couples the gate electrode 74 of the amplification transistor AMP and the source of the reset transistor RST to each other. Here, the total number of the through-wiring lines 47 and 48 is more than the total number of the sensor pixels 12 included in the first substrate 10, and is twice the total number of the sensor pixels 12 included in the first substrate 10. In addition, the total number of the through-wiring lines 47 and 48 and the coupling section 54 is more than the total number of the sensor pixels 12 included in the first substrate 10, and is three times the total number of the sensor pixels 12 included in the first substrate 10.

The wiring layer 56 further includes, for example, a plurality of pad electrodes 58 inside the insulating layer 57. Each of the pad electrodes 58 is formed by a metal such as Cu (copper) or aluminum (Al), for example. Each of the pad electrodes 58 is exposed to a front surface of the wiring layer 56. Each of the pad electrodes 58 is used for electric coupling between the second substrate 20 and the third substrate 30 as well as for attaching the second substrate 20 and the third substrate 30 together. The plurality of pad electrodes 58 are provided one by one for the respective pixel drive lines 23 and the respective vertical signal lines 24, for example. Here, the total number of the pad electrodes 58 (or the total number of junctions between the pad electrodes 58 and pad electrodes 64 (described later) is less than the total number of the sensor pixels 12 included in the first substrate 10.

The third substrate 30 has a configuration in which an interlayer insulating film 61 is stacked on the semiconductor substrate 31, for example. It is to be noted that, as described later, the third substrate 30 is attached to the second substrate 20 by the surfaces on the sides of the front surfaces; therefore, in describing the configurations inside the third substrate 30, a vertical relationship to be described is opposite to the vertical direction in the drawing. The semiconductor substrate 31 is configured by a silicon substrate. The third substrate 30 has a configuration in which the logic circuit 32 is provided at a part of the semiconductor substrate 31 on side of a front surface. The third substrate 30 further includes, for example, a wiring layer 62 on the interlayer insulating film 61. The wiring layer 62 includes, for example, an insulating layer 63 and a plurality of pad electrodes 64 provided inside the insulating layer 63. The plurality of pad electrodes 64 is electrically coupled to the logic circuit 32. Each of the pad electrodes 64 is formed by Cu (copper), for example. Each of the pad electrodes 64 is exposed to a front surface of the wiring layer 62. Each of the pad electrodes 64 is used for electric coupling between the second substrate 20 and the third substrate 30 as well as for attaching the second substrate 20 and the third substrate 30 together. In addition, the pad electrode 64 need not necessarily be a plurality of pad electrodes; even one pad electrode is able to be electrically coupled to the logic circuit 32. The second substrate 20 and the third substrate 30 are electrically coupled to each other by junctions between the pad electrodes 58 and 64. That is, the gate (transfer gate TG) of the transfer transistor TR is electrically coupled to the logic circuit 32 via the coupling section 54 and the pad electrodes 58 and 64. The third substrate 30 is attached to the second substrate 20, with the front surface of the semiconductor substrate 31 being opposed to side of a front surface of the semiconductor substrate 21.

As illustrated in FIGS. 3 and 4, the first substrate 10 and the second substrate 20 are electrically coupled to each other by the coupling section 54. In addition, as illustrated in FIG. 3, the second substrate 20 and the third substrate 30 are electrically coupled to each other by the junctions between the pad electrodes 58 and 64. Here, the readout circuit 22 is formed in the second substrate 20, and the logic circuit 32 is formed in the third substrate 30, thus making it possible to form the structure for electrically coupling the second substrate 20 and the third substrate 30 to each other, to have a more free layout in terms of the number of contacts for arrangement and coupling, etc., than the structure for electrically coupling the first substrate 10 and the second substrate 20 to each other. Thus, it is possible to use the junction between the pad electrodes 58 and 64, as the structure for electrically coupling the second substrate 20 and the third substrate 30 to each other.

Figure 5:
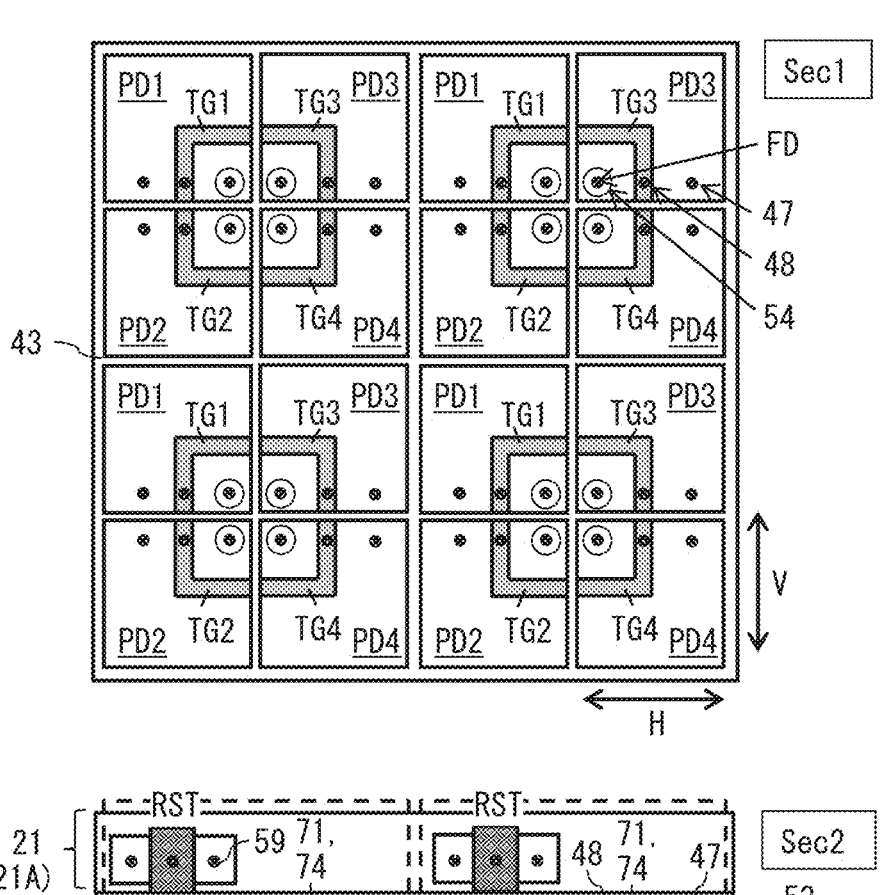
FIG. 5 illustrates an example of each cross-sectional configuration along Sec1 and Sec2 of FIG. 4.
Figure 5:
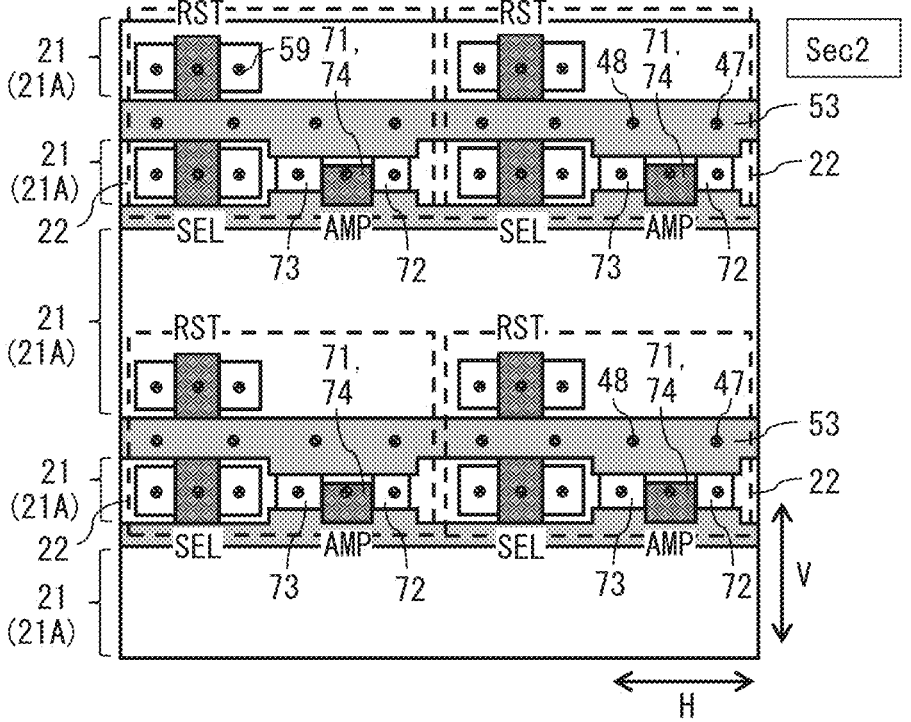

FIG. 5 illustrates an example of a cross-sectional configuration in a horizontal direction of the imaging element 1. A diagram on upper side of FIG. 5 illustrates an example of a cross-sectional configuration along a cross-section Sec1 of FIG. 3, and a diagram on lower side of FIG. 5 illustrates an example of a cross-sectional configuration along a cross-section Sec2 of FIG. 3. FIG. 5 exemplifies a configuration in which four sets of four sensor pixels 12 of 2×2 are arranged in a first direction H and a second direction V. It is to be noted that, in the cross-sectional view on the upper side of FIG. 5, a diagram illustrating an example of the front surface configuration of the semiconductor substrate 11 is superimposed on a diagram illustrating the example of the cross-sectional configuration along the cross-section Sec1 of FIG. 3, with the insulating layer 46 being omitted. In addition, in the cross-sectional view on the lower side of FIG. 5, a diagram illustrating an example of the front surface configuration of the semiconductor substrate 21 is superimposed on the diagram illustrating the example of the cross-sectional configuration along the cross-section Sec2 of FIG. 3.

As illustrated in FIG. 5, the plurality of coupling sections 54, the plurality of through-wiring lines 48, and the plurality of through-wiring lines 47 are arranged side by side in a strip shape in the first direction H (horizontal direction in FIG. 5) in the plane of the first substrate 10. It is to be noted that FIG. 5 exemplifies the case where the plurality of coupling sections 54, the plurality of through-wiring lines 48, and the plurality of through-wiring lines 47 are arranged side by side in two rows in the first direction H. The first direction H is parallel to one arrangement direction (e.g., column direction) of two arrangement directions (e.g., row direction and column direction) of the plurality of sensor pixels 12 arranged in matrix. In the four sensor pixels 12 sharing the readout circuit 22, four floating diffusions FD are arranged close to each other, for example, with the element separation section 43 interposed therebetween. In the four sensor pixels 12 sharing the readout circuit 22, four transfer gates TG are arranged to surround the four floating diffusions FD, and the four transfer gates TG form an annular shape, for example. That is, a plurality of floating diffusions FD included in the first substrate 10 are equally divided into a plurality of groups.

The insulating layer 53 is configured by a plurality of blocks extending in the first direction H. The semiconductor substrate 21 extends in the first direction H, and is configured by a plurality of island-shaped blocks 21A arranged side by side in the second direction V orthogonal to the first direction H, with the insulating layer 53 interposed therebetween. Each block 21A is provided with, for example, a plurality of sets of the reset transistors RST, the amplification transistors AMP, and the selection transistors SEL. The one readout circuit 22 shared by the four sensor pixels 12 (i.e., four floating diffusions) is configured by, for example, the reset transistor RST, the amplification transistor AMP, and the selection transistor SEL inside a region facing the four sensor pixels 12. The one readout circuit 22 shared by the four sensor pixels 12 is configured by, for example, the amplification transistor AMP inside the left adjacent block 21A of the insulating layer 53, and the reset transistor RST and the selection transistor SEL inside the right adjacent block 21A of the insulating layer 53. That is, the plurality of readout circuits 22 are equally divided for the respective groups described above, and are assigned one by one to the respective groups described above.

For example, four coupling sections 54 adjacent to one another are each in contact with the lower end of the gate electrode 74 of the amplification transistor AMP, and are each electrically coupled to the gate electrode 74 of the amplification transistor AMP. The four coupling sections 54 adjacent to one another are each further electrically coupled to the gate of the reset transistor RST, for example, via the gate electrode 74 of the amplification transistor AMP, the coupling wiring line 55 and the coupling section 59. That is, the four floating diffusions FD are each linked to the lower end of the gate electrode 74 via the coupling section 54 to thereby be electrically coupled to a corresponding amplification transistor AMP. It is to be noted that the floating diffusion FD may be linked directly to the lower end of the gate electrode 74 to thereby be electrically coupled to the corresponding amplification transistor AMP.

Next, description is given of the amplification transistor AMP, the reset transistor RST, and the selection transistor SEL.

In the present embodiment, the reset transistor RST and the selection transistor SEL are of a planar type, for example, as illustrated in FIGS. 4 and 5. Meanwhile, as illustrated in FIGS. 4 and 5, the amplification transistor AMP includes, for example, a channel region 71, a source region 72 and a drain region 73 inside an inner surface of an opening formed by selective etching with respect to the semiconductor substrate 21. That is, the amplification transistor AMP includes the channel region 71, the source region 72, and the drain region 73 in a plane intersecting the front surface of the semiconductor substrate 21. The amplification transistor AMP further includes a gate insulating film 76 in contact with the channel region 71, and includes the gate electrode 74 opposed to the channel region 71 with the gate insulating film 76 interposed therebetween. That is, the amplification transistor AMP is of a vertical-gate type. The amplification transistor AMP may be, for example, a junctionless transistor in which the channel region 71, the source region 72, and the drain region 73 have the same polarity.

The gate electrode 74 is formed, for example, by impurity-doped polysilicon, silicided silicon, or a metal material that controls a work function. The gate electrode 74 extends in a direction parallel to a plane in which the channel region 71, the source region 72 and the drain region 73 are formed (i.e., a thickness direction of the semiconductor substrate 21). That is, in the amplification transistor AMP, the channel width is not restricted to the size of the sensor pixel 12 formed in the first substrate 10. The gate electrode 74 further extends into the insulating layer 46. The lower end of the gate electrode 74 is in contact with the plurality of coupling sections 54, and is electrically coupled to the plurality of floating diffusions FD shared by one readout circuit 22. That is, a wiring line that electrically couples the gate electrode 74 and the floating diffusion FD together is formed at the shortest distance between the gate electrode 74 and the floating diffusion FD without passing through the wiring layer 56.

It is to be noted that, in the gate electrode 74, a part opposed to the channel region 71 and a part coupled to the plurality of coupling sections 54 may be formed collectively, or may be formed separately in the course of manufacturing. In a case where, in the gate electrode 74, the part opposed to the channel region 71 and the part coupled to the plurality of coupling sections 54 are formed separately in the course of manufacturing, the part opposed to the channel region 71 and the part coupled to the plurality of coupling sections 54 may be formed by the same material or may be formed by different materials, in the gate electrode 74.

In addition, in the present embodiment, a hard mask 75 to be used for the selective etching remains on the top surface of the channel region 71, and the hard mask 75 does not function as a gate insulating film.

[Manufacturing Method]

Next, description is given of a manufacturing method of the imaging element 1.

First, the p-well layer 42, the element separation section 43, and the p-well layer 44 are formed in the semiconductor substrate 11. Next, the photodiode PD, the transfer transistor TR and the floating diffusion FD are formed in the semiconductor substrate 11. This allows for formation of the sensor pixel 12 in the semiconductor substrate 11. Thereafter, the insulating layer 46 is formed on the semiconductor substrate 11.

At this time, for example, lithography or dry etching is used to form, inside the insulating layer 46, in advance, the plurality of coupling sections 54 and a part of the gate electrode 74 (hereinafter, referred to as a "gate electrode layer 74'") to be in contact with upper parts of the plurality of coupling sections 54. When removing an excess material generated upon formation of each of the coupling sections 54 and the gate electrode layer 74', for example, dry etching or CMP is used. In this manner, the first substrate 10 is formed.

Next, the semiconductor substrate 21 is attached onto the first substrate 10 (insulating layer 46). At this time, the semiconductor substrate 21 is thinned as necessary. At this occasion, the thickness of the semiconductor substrate 21 is set to a film thickness required for formation of the readout circuit 22. In addition, at this occasion, injection may be performed for adjusting a concentration of impurities contained in the semiconductor substrate 21.

Next, the hard mask 75 having a predetermined pattern shape is formed on the front surface of the semiconductor substrate 21. Subsequently, dry etching is performed on the semiconductor substrate 21 through the hard mask 75, to thereby form the channel region 71 of the amplification transistor AMP. At this time, overetching the semiconductor substrate 21 causes a front surface of the gate electrode layer 74' in the insulating layer 46 to be exposed. The channel region 71 is positioned on the inner surface of the opening formed in the semiconductor substrate 21.

Next, the gate insulating film 76 is formed by oxidization or film formation of the inner surface of the opening formed in the semiconductor substrate 21. At this time, the gate insulating film 76 is formed by, for example, a high-permittivity insulating material such as $SiO_2$, SiN, or $HfO_2$. Subsequently, for example, an electrically-conductive material such as impurity-doped polysilicon, silicided Si (silicon) or a metal material that controls a work function is used to form a film on the entire front surface including the gate insulating film 76, and thereafter the film-formed electrically-conductive material is etched in a self-aligned manner. This allows the electrically-conductive material to remain on a side surface of the channel region 71, and the electrically-conductive material to be removed on a top surface of the semiconductor substrate 21 as well as a bottom surface of the opening of the semiconductor substrate 21. At this time, an oxide film covering a front surface of the gate electrode layer 74' is also removed. As a result, the front surface of the gate electrode layer 74' is exposed to the bottom surface of the opening of the semiconductor substrate 21.

Next, for example, a low-resistance material such as impurity-doped polysilicon, silicided Si (silicon), W (tungsten) or Cu (copper) is used to form a film on the entire front surface including the remaining electrically-conductive material and the front surface of the gate electrode layer 74'. Subsequently, for example, lithography or dry etching is used to selectively remove the low-resistance material. This allows for formation of the gate electrode 74 of the amplification transistor AMP, and the like. At this time, the gate insulating film 76 formed on an unnecessary location is removed.

Next, for example, ion implantation, solid phase diffusion, or the like is used to form the source region 72 and the drain region 73 of the amplification transistor AMP. This allows for formation of the source region 72 and the drain region 73 of the amplification transistor AMP on a location, of a side surface of the opening of the semiconductor substrate 21, not coated with the gate electrode 74, or the like.

Next, the insulating layers 53 and 52 are formed to embed the amplification transistor AMP, or the like. Subsequently, an opening is provided at a predetermined location of the insulating layer 52, and thereafter, for example, the low-resistance material such as impurity-doped polysilicon, silicided Si (silicon), W (tungsten) or Cu (copper) is used to form a film on the entire front surface including the opening of the insulating layer 52. Subsequently, for example, lithography or dry etching is used to selectively remove the low-resistance material. This allows for formation of the plurality of coupling sections 59, the plurality of coupling wiring lines 55, and the plurality of through-wiring lines 47 and 48.

Thereafter, a conventional method is used to form the wiring layer 56 on the plurality of coupling wiring lines 55. This allows for formation of the second substrate 20. Further, a conventional method is used to form the interlayer insulating film 61 and the wiring layer 62 on the semiconductor substrate 31, and thereafter the third substrate 30 is attached to the second substrate 20, with side of the wiring layer 62 facing the wiring layer 56. This allows for electrical coupling between the second substrate 20 and the third substrate 30. Finally, the color filters 40 and the light-receiving lens 50 are attached to the back surface (light-receiving surface) of the first substrate 10. In this manner, the imaging element 1 according to the present embodiment is manufactured.

Effects

Next, description is given of effects of the imaging element 1 according to the present embodiment.

Miniaturization of an area per pixel of a two-dimensionally structured imaging element has heretofore been achieved by introduction of a miniaturizing process and improvement in packaging density. In recent years, in order to achieve further size reduction in an imaging element and higher pixel density, a three-dimensionally structured imaging element has been developed. In the three-dimensionally structured imaging element, for example, a semiconductor substrate including a plurality of photoelectric conversion sections and a semiconductor substrate including an amplification transistor that generates a signal of a voltage corresponding to a level of charges obtained at each photoelectric conversion section are stacked on each other. However, in a case of coupling a lower semiconductor substrate and an upper semiconductor substrate together using a wiring line, the length of the wiring line becomes longer, and increased parasitic capacitance may possibly deteriorate efficient conversion.

Meanwhile, in the present embodiment, the amplification transistor AMP is provided that includes the channel region 71, the source region 72 and the drain region 73 in a plane intersecting the front surface of the semiconductor substrate 21 and also includes the gate electrode 74 being opposed to the channel region 71 with the gate insulating film 76 interposed therebetween and being electrically coupled to the floating diffusion FD. This enables the length of the wiring line coupling the amplification transistor AMP and the floating diffusion FD together to be shorter, thus making it possible to reduce the parasitic capacitance. As a result, it is possible to suppress a decrease in the efficient conversion.

In addition, in the present embodiment, the gate electrode 74 extends in the direction parallel to the plane in which the channel region 71, the source region 72, and the drain region 73 are formed (i.e., thickness direction of the semiconductor substrate 21). Thus, in the amplification transistor AMP, the channel width is not restricted to the size of the sensor pixel 12 formed in the first substrate 10, thus making it possible to reduce on-resistance of the amplification transistor AMP by increasing the channel width, which enables achievement of lower noise. In addition, in the amplification transistor AMP, a channel region is able to be expanded, thus making it possible to improve conversion efficiency.

In addition, in the present embodiment, the lower end of the gate electrode 74 is in contact with the plurality of coupling sections 54, and is electrically coupled to the plurality of floating diffusions FD shared by one readout circuit 22. This makes it possible to form the wiring line that electrically couples the gate electrode 74 and the floating diffusion FD together at the shortest distance between the gate electrode 74 and the floating diffusion FD without passing through the wiring layer 56. As a result, it is possible to reduce wiring capacitance, and thus to suppress the decrease in the efficient conversion.

2. MODIFICATION EXAMPLES

Hereinafter, description is given of modification examples of the imaging element 1 according to the foregoing embodiment.

Modification Example A

In the foregoing embodiment, the amplification transistor AMP has a fully depleted three-terminal (gate, source and drain) device structure. However, in the foregoing embodiment, in a case where the semiconductor substrate 21 includes a well region 25 around the channel region 71, the source region 72 and the drain region 73, for example, as illustrated in FIG. 6, the second substrate 20 may be provided with the coupling section 59 in contact with the well region 25, and the coupling section 59 may be set as a fourth terminal of the amplification transistor AMP. In such a case, it is possible to fix an electric potential of the well region 25 via the coupling section 59, which makes it possible to suppress a substrate floating effect of the amplification transistor AMP and thus to suppress dispersion in characteristics.

Modification Example B

In the amplification transistor AMP according to the foregoing embodiment, for example, as illustrated FIGS. 7, 8, and 9, the gate electrode 74 may have a double-gate structure sandwiching the channel region 71 from a direction parallel to the front surface of the semiconductor substrate 21. FIG. 9 illustrates a planar configuration example of the amplification transistor of FIG. 7. At this time, the amplification transistor AMP may be, for example, a junctionless transistor in which the channel region 71, the source region 72, and the drain region 73 have the same polarity. In addition, the gate electrode 74 is configured by a first partial electrode 74A and a second partial electrode 74B that sandwich the channel region 71 from the direction parallel to the front surface of the semiconductor substrate 21, and a third partial electrode 74C electrically coupled to the first partial electrode 74A and the second partial electrode 74B. In such a case, the channel width is increased by a factor of two, thus enabling further reduction in the on-resistance as well as noise reduction.

Modification Example C

In the amplification transistor AMP according to the foregoing embodiment, for example, as illustrated in FIGS. 8 and 10, the gate electrode 74 may have a tri-gate structure sandwiching the channel region 71 from a direction parallel to the front surface of the semiconductor substrate 21 and being opposed to the channel region 71 with the gate insulating film 76 interposed therebetween in a direction intersecting the front surface of the semiconductor substrate 21. At this time, the amplification transistor AMP may be, for example, a junctionless transistor in which the channel region 71, the source region 72 and the drain region 73 have the same polarity. In addition, the gate electrode 74 is configured by the first partial electrode 74A and the second partial electrode 74B that sandwich the channel region 71 from the direction parallel to the front surface of the semiconductor substrate 21, and the third partial electrode 74C being electrically coupled to the first partial electrode 74A and the second partial electrode 74B and being opposed to the channel region 71 with the gate insulating film 76 interposed therebetween. In such a case, the channel width is able to be increased by a factor of two or more, thus enabling further reduction in the on-resistance. It is also possible to expect further noise reduction effects.

Modification Example D

Figure 11:
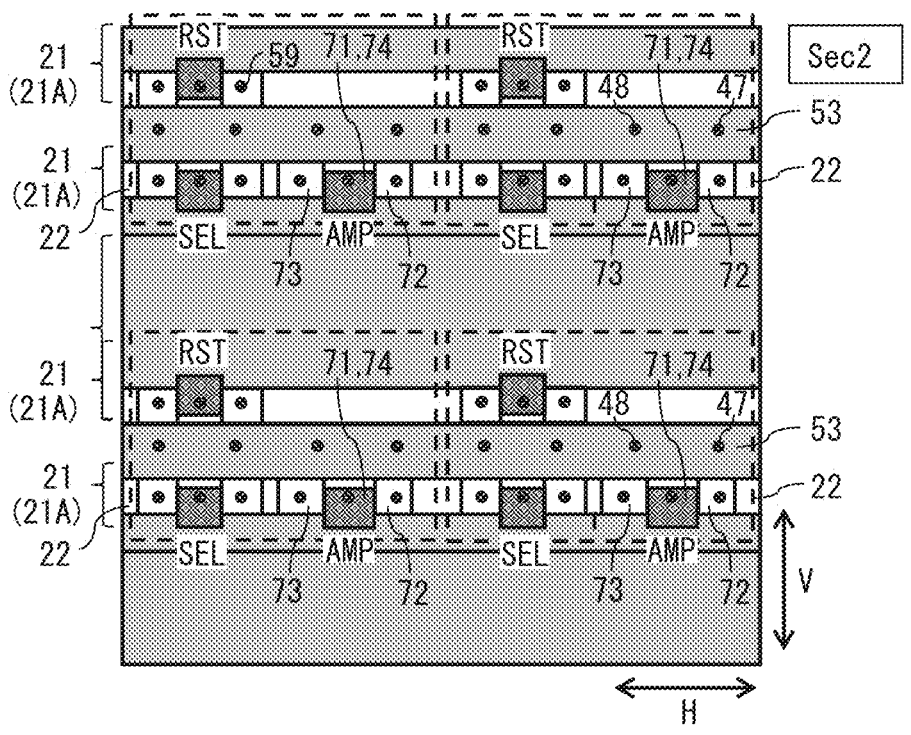
FIG. 11 illustrates a modification example of the cross-sectional configuration along Sec2 of FIG. 4.
Figure 12:
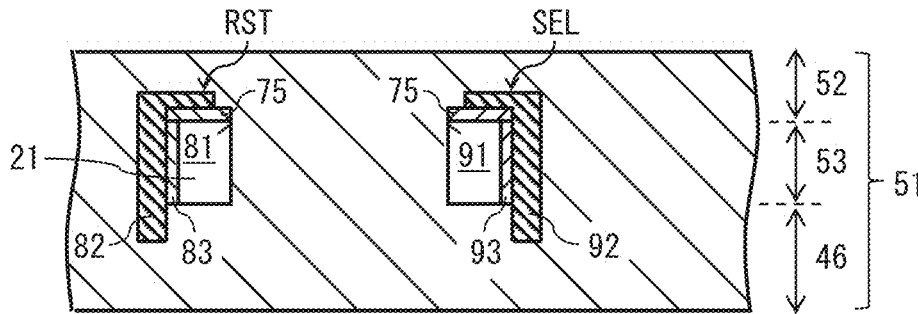
FIG. 12 illustrates an example of a cross-sectional configuration in a vertical direction of an RST and an SEL of FIG. 11.

In the foregoing embodiment and Modification Examples A to C, as illustrated in FIGS. 11 and 12, for example, the reset transistor RST and the selection transistor SEL may also each have a vertical-gate structure similar to the amplification transistor AMP depicted in FIG. 4. It is to be noted that FIG. 12 illustrates an example of a cross-sectional configuration in the vertical direction of reset transistor RST and the selection transistor SEL of FIG. 11.

The reset transistor RST includes, for example, a channel region 81, a source region and a drain region inside the inner surface of an opening formed by selective etching with respect to the semiconductor substrate 21, as illustrated in FIG. 12. That is, the reset transistor RST includes the channel region 81, the source region and the drain region in a plane intersecting the front surface of the semiconductor substrate 21. The reset transistor RST further includes a gate insulating film 83 in contact with the channel region 81, and includes a gate electrode 82 opposed to the channel region 81 with the gate insulating film 83 interposed therebetween. It is to be noted that, a hard mask 75 to be used for the selective etching remains on a top surface of the channel region 81; the hard mask 75 does not function as a gate insulating film.

The gate electrode 82 is formed, for example, by impurity-doped polysilicon, silicided silicon, or a metal material that controls a work function. The gate electrode 82 extends in a direction parallel to a plane in which the channel region 81, the source region and the drain region are formed (i.e., thickness direction of the semiconductor substrate 21). That is, in the reset transistor RST, the channel width is not restricted to the size of the sensor pixel 12 formed in the first substrate 10.

The selection transistor SEL includes, for example, a channel region 91, a source region and a drain region inside the inner surface of an opening formed by selective etching with respect to the semiconductor substrate 21, as illustrated in FIG. 12. That is, the selection transistor SEL includes the channel region 91, the source region and the drain region in a plane intersecting the front surface of the semiconductor substrate 21. The selection transistor SEL further includes a gate insulating film 93 in contact with the channel region 91, and includes a gate electrode 92 opposed to the channel region 91 with the gate insulating film 93 interposed therebetween. It is to be noted that, the hard mask 75 to be used for the selective etching remains on a top surface of the channel region 91; the hard mask 75 does not function as a gate insulating film.

The gate electrode 92 is formed, for example, by impurity-doped polysilicon, silicided silicon, or a metal material that controls a work function. The gate electrode 92 extends in a direction parallel to a plane in which the channel region 91, the source region and the drain region are formed (i.e., thickness direction of the semiconductor substrate 21). That is, in the selection transistor SEL, the channel width is not restricted to the size of the sensor pixel 12 formed in the first substrate 10.

In a case where the reset transistor RST and the selection transistor SEL each also have a vertical-gate structure similar to that of the amplification transistor AMP depicted in FIG. 4 in this manner, the amplification transistor AMP, the reset transistor RST and the selection transistor SEL are able to be formed by a common process in the course of manufacturing, thus enabling the manufacturing process to be simplified. In addition, in this case, gate electrodes of the reset transistor RST and the selection transistor SEL are able to be directly coupled to other wiring lines (e.g., wiring lines for driving the reset transistor RST and the selection transistor SEL).

Figure 13:
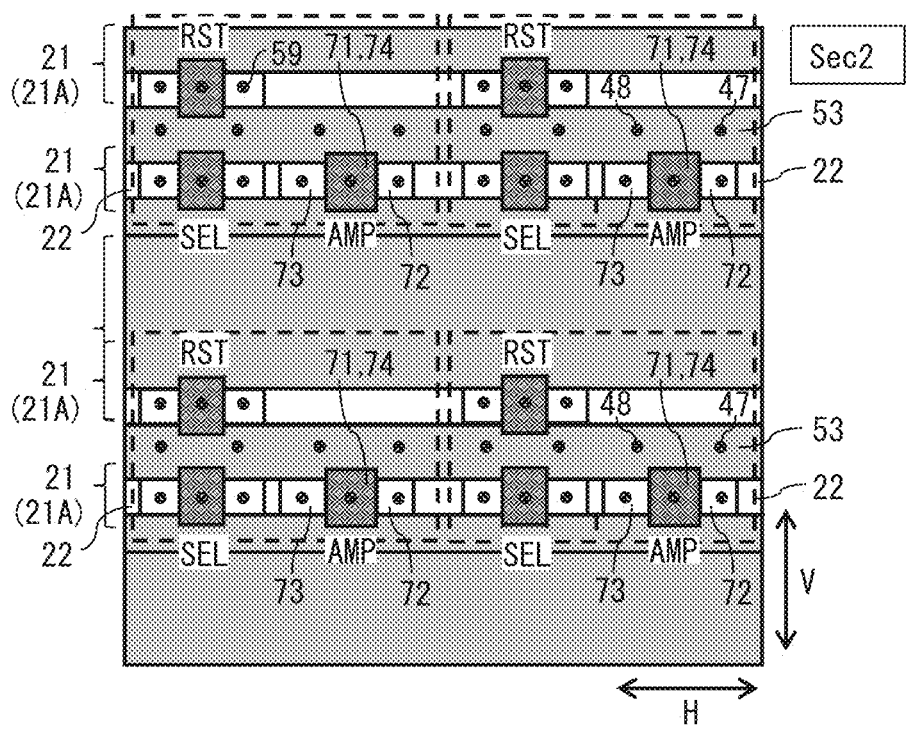
FIG. 13 illustrates a modification example of the cross-sectional configuration along Sec2 of FIG. 4.
Figure 14:
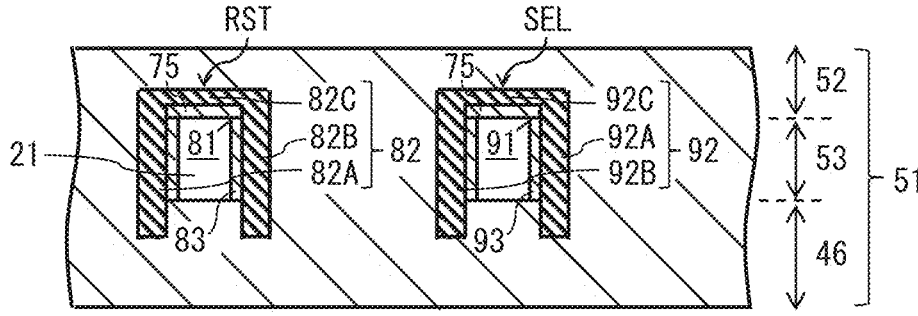
FIG. 14 illustrates an example of a cross-sectional configuration in the vertical direction of an RST and an SEL of FIG. 13.

In addition, in the foregoing embodiment and Modification Examples A to C, the reset transistor RST and the selection transistor SEL may each also have a vertical-gate structure similar to that of the amplification transistor AMP depicted in FIG. 7, for example, as illustrated in FIGS. 13 and 14. It is to be noted that FIG. 14 illustrates an example of a cross-sectional configuration in the vertical direction of the reset transistor RST and the selection transistor SEL of FIG. 13.

The reset transistor RST includes, for example, the channel region 81, the source region and the drain region inside the inner surface of an opening formed by selective etching with respect to the semiconductor substrate 21, as illustrated in FIG. 14. That is, the reset transistor RST includes the channel region 81, the source region and the drain region in a plane intersecting the front surface of the semiconductor substrate 21. The reset transistor RST further includes the gate insulating film 83 in contact with the channel region 81, and includes the gate electrode 82 opposed to the channel region 81 with the gate insulating film 83 interposed therebetween.

The gate electrode 82 has a double-gate structure sandwiching the channel region 81 from a direction parallel to the front surface of the semiconductor substrate 21. The gate electrode 82 is configured by a first partial electrode 82A and a second partial electrode 82B that sandwich the channel region 81 from the direction parallel to the front surface of the semiconductor substrate 21, and a third partial electrode 82C electrically coupled to the first partial electrode 82A and the second partial electrode 82B. In this case, the channel width is increased by a factor of two, thus enabling further reduction in the on-resistance as well as noise reduction.

The selection transistor SEL includes, for example, the channel region 91, the source region and the drain region inside the inner surface of an opening formed by selective etching with respect to the semiconductor substrate 21, as illustrated in FIG. 14. That is, the selection transistor SEL includes the channel region 91, the source region and the drain region in a plane intersecting the front surface of the semiconductor substrate 21. The selection transistor SEL further includes the gate insulating film 93 in contact with the channel region 91, and includes the gate electrode 92 opposed to the channel region 91 with the gate insulating film 93 interposed therebetween.

The gate electrode 92 has a double-gate structure sandwiching the channel region 91 from a direction parallel to the front surface of the semiconductor substrate 21. The gate electrode 92 is configured by a first partial electrode 92A and a second partial electrode 92B that sandwich the channel region 91 from the direction parallel to the front surface of the semiconductor substrate 21, and a third partial electrode 92C electrically coupled to the first partial electrode 92A and the second partial electrode 92B. In this case, the channel width is increased by a factor of two, thus enabling further reduction in the on-resistance as well as noise reduction.

In a case where the reset transistor RST and the selection transistor SEL each also have a structure similar to that of the amplification transistor AMP of the double-gate type depicted in FIG. 7 in this manner, the amplification transistor AMP, the reset transistor RST and the selection transistor SEL are able to be formed by a common process in the course of manufacturing, thus enabling the manufacturing process to be simplified. In addition, in this case, gate electrodes of the reset transistor RST and the selection transistor SEL are able to be directly coupled to other wiring lines (e.g., wiring lines for driving the reset transistor RST and the selection transistor SEL).

Figure 15:
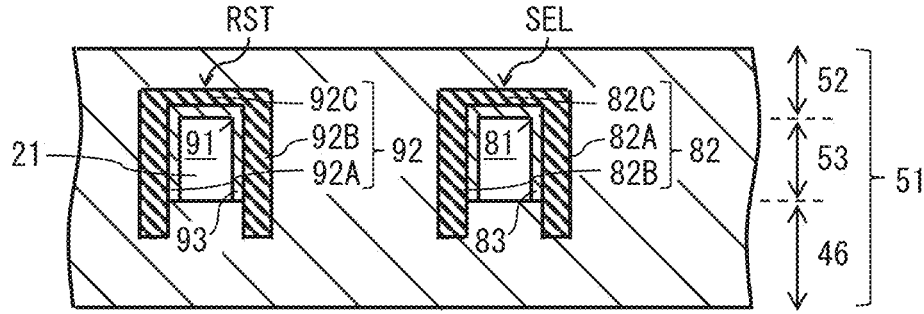
FIG. 15 illustrates an example of a cross-sectional configuration in the vertical direction of the RST and the SEL of FIG. 13.

In addition, in the foregoing embodiment and Modification Examples A to C, the reset transistor RST and the selection transistor SEL may each also have a vertical-gate structure similar to that of the amplification transistor AMP depicted in FIG. 10, for example, as illustrated in FIGS. 13 and 15. It is to be noted that FIG. 15 illustrates an example of a cross-sectional configuration in the vertical direction of the reset transistor RST and the selection transistor SEL of FIG. 13.

The reset transistor RST includes, for example, the channel region 81, the source region and the drain region inside the inner surface of an opening formed by selective etching with respect to the semiconductor substrate 21, as illustrated in FIG. 15. That is, the reset transistor RST includes the channel region 81, the source region and the drain region in a plane intersecting the front surface of the semiconductor substrate 21. The reset transistor RST further includes the gate insulating film 83 in contact with the channel region 81, and includes the gate electrode 82 opposed to the channel region 81 with the gate insulating film 83 interposed therebetween.

The gate electrode 82 may have a tri-gate structure sandwiching the channel region 81 from a direction parallel to the front surface of the semiconductor substrate 21 and being opposed to the channel region 81 with the gate insulating film 83 interposed therebetween in a direction intersecting the front surface of the semiconductor substrate 21. The gate electrode 82 is configured by the first partial electrode 82A and the second partial electrode 82B that sandwich the channel region 81 from the direction parallel to the front surface of the semiconductor substrate 21, and the third partial electrode 82C electrically coupled to the first partial electrode 82A and the second partial electrode 82B and being opposed to the channel region 81 with the gate insulating film 83 interposed therebetween. In this case, the channel width is able to be increased by a factor of two or more, thus enabling further reduction in the on-resistance. It is also possible to expect further noise reduction effects.

The selection transistor SEL includes, for example, the channel region 91, the source region and the drain region inside the inner surface of an opening formed by selective etching with respect to the semiconductor substrate 21, as illustrated in FIG. 15. That is, the selection transistor SEL includes the channel region 91, the source region and the drain region in a plane intersecting the front surface of the semiconductor substrate 21. The selection transistor SEL further includes the gate insulating film 93 in contact with the channel region 91, and includes the gate electrode 92 opposed to the channel region 91 with the gate insulating film 93 interposed therebetween.

The gate electrode 92 may have a tri-gate structure sandwiching the channel region 91 from a direction parallel to the front surface of the semiconductor substrate 21 and being opposed to the channel region 91 with the gate insulating film 93 interposed therebetween in a direction intersecting the front surface of the semiconductor substrate 21. The gate electrode 92 is configured by the first partial electrode 92A and the second partial electrode 92B that sandwich the channel region 91 from the direction parallel to the front surface of the semiconductor substrate 21, and the third partial electrode 92C electrically coupled to the first partial electrode 92A and the second partial electrode 92B and being opposed to the channel region 81 with the gate insulating film 93 interposed therebetween. In this case, the channel width is able to be increased by a factor of two or more, thus enabling further reduction in the on-resistance. It is also possible to expect further noise reduction effects.

In a case where the reset transistor RST and the selection transistor SEL each also have a structure similar to that of the amplification transistor AMP in this manner, the amplification transistor AMP, the reset transistor RST and the selection transistor SEL are able to be formed by a common process in the course of manufacturing, thus enabling the manufacturing process to be simplified. In addition, in this case, gate electrodes of the reset transistor RST and the selection transistor SEL are able to be directly coupled to other wiring lines (e.g., wiring lines for driving the reset transistor RST and the selection transistor SEL).

Modification Example E

Figure 16:
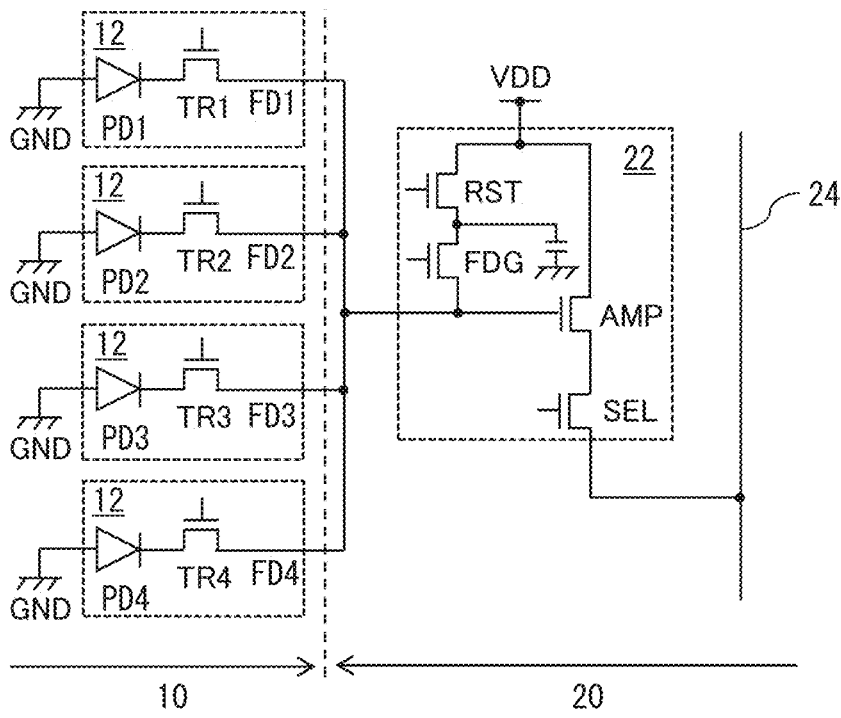
FIG. 16 illustrates an example of a circuit configuration of the sensor pixel and the readout circuit of FIG. 1.

In the foregoing embodiment and Modification Examples A to D, the imaging element 1 may include an FD transfer transistor FDG, for example, as illustrated in FIG. 16. In this case, the FD transfer transistor FDG is provided, for example, between the source of the reset transistor RST and the gate of the amplification transistor AMP.

The FD transfer transistor FDG is used to switch conversion efficiency. In general, the pixel signal is small when shooting in a dark place. Upon performing charge-voltage conversion on the basis of $Q=CV$, large capacitance of the floating diffusion FD (an FD capacitance C) results in small V at the time of conversion into a voltage by the amplification transistor AMP. Meanwhile, in a bright location, the pixel signal becomes large, and thus the floating diffusion FD is not able to receive charges of the photodiode PD, unless the FD capacitance C is large. Further, the FD capacitance C needs to be large not to allow V at the time of conversion into a voltage by the amplification transistor AMP to be too large (in other words, to allow V to be small). In consideration thereof, when the FD transfer transistor FDG is turned ON, a gate capacitance for the FD transfer transistor FDG is increased, and thus the total FD capacitance C is increased. Meanwhile, when the FD transfer transistor FDG is turned OFF, the total FD capacitance C becomes small. In this manner, switching ON/Off of the FD transfer transistor FDG allows the FD capacitance C to be variable, thus making it possible to switch the conversion efficiency.

Figure 17:
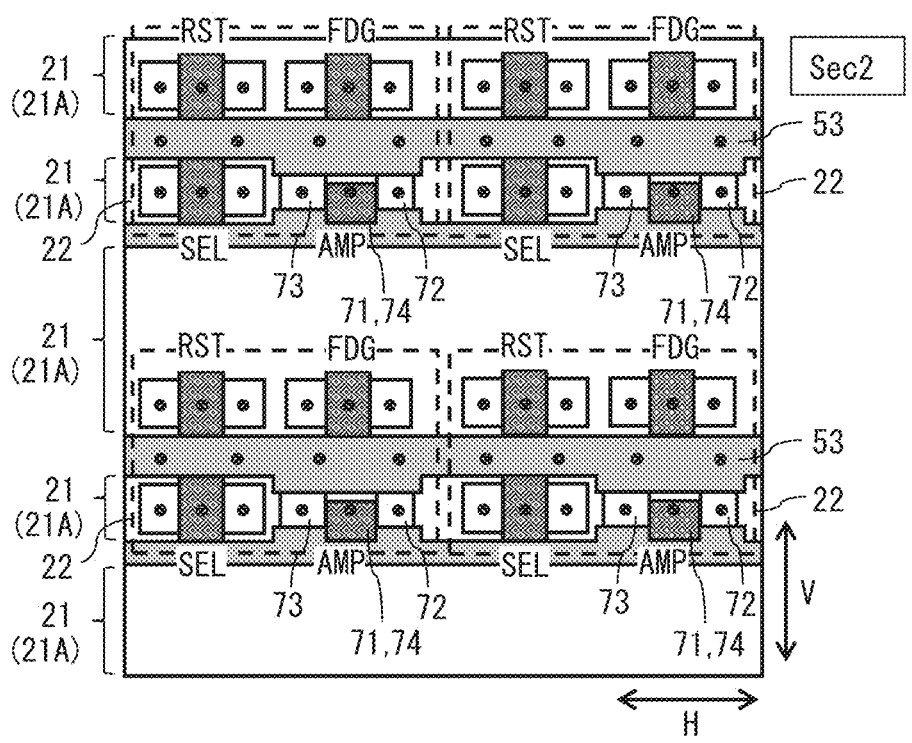
FIG. 17 illustrates an example of a cross-sectional configuration along Sec2 of an imaging element including the circuit of FIG. 16.
Figure 18:
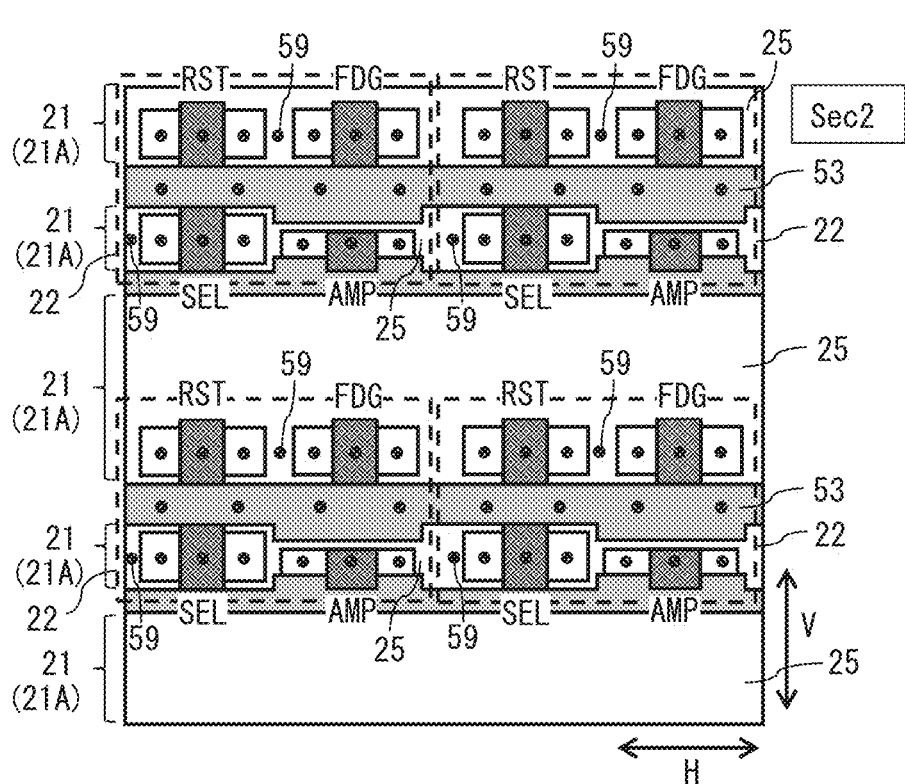
FIG. 18 illustrates a modification example of the cross-sectional configuration along Sec2 of the imaging element including the circuit of FIG. 16.
Figure 19:
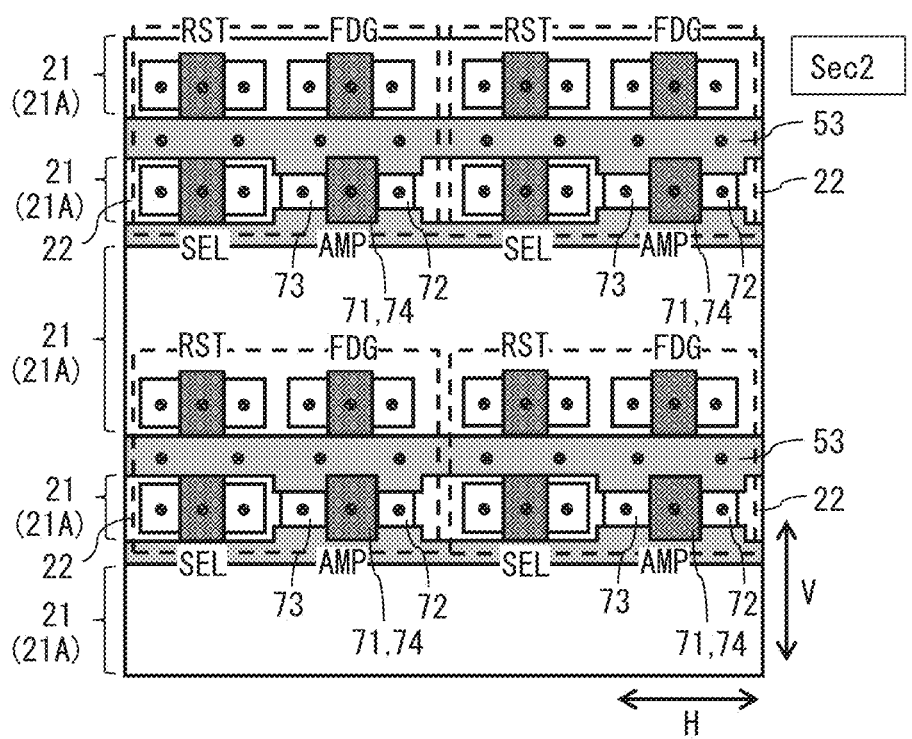
FIG. 19 illustrates a modification example of the cross-sectional configuration along Sec2 of the imaging element including the circuit of FIG. 16.
Figure 20:
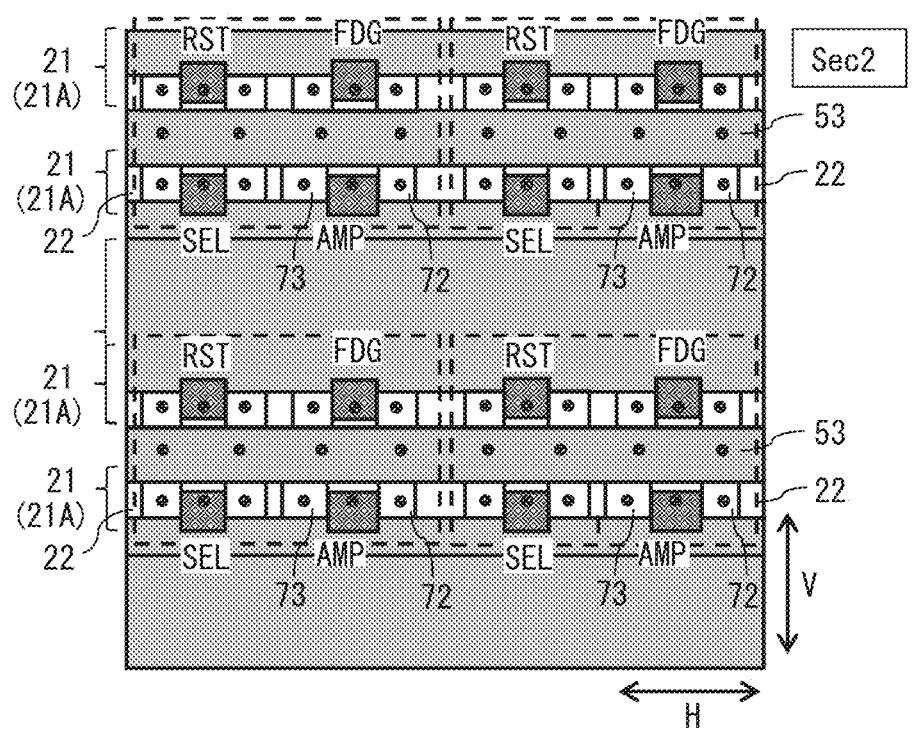
FIG. 20 illustrates a modification example of the cross-sectional configuration along Sec2 of the imaging element including the circuit of FIG. 16.
Figure 21:
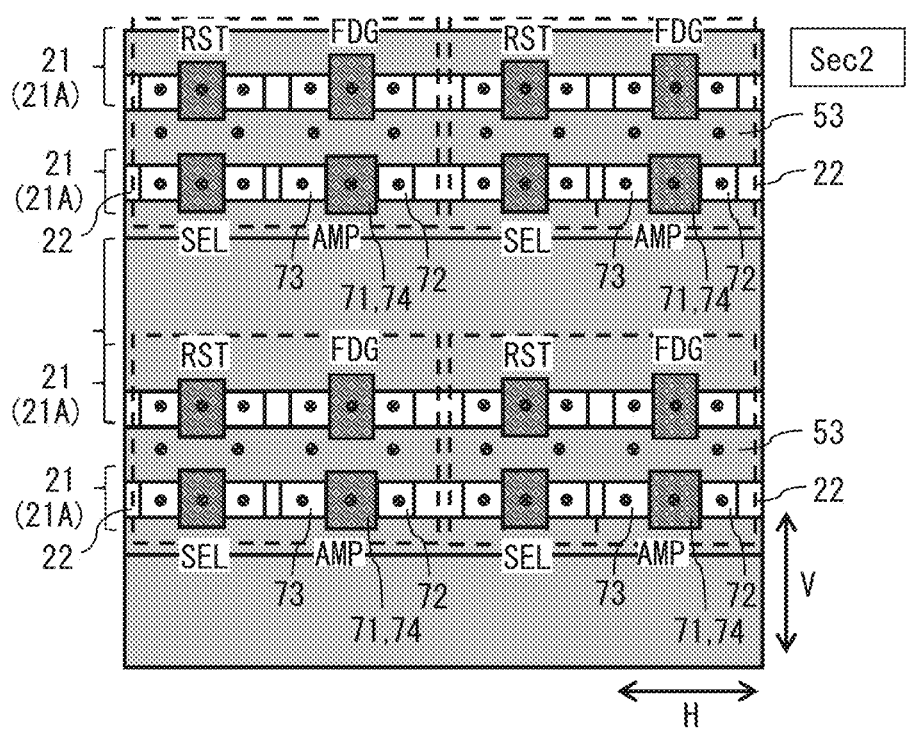
FIG. 21 illustrates a modification example of the cross-sectional configuration along Sec2 of the imaging element including the circuit of FIG. 16.

In the foregoing embodiment, the FD transfer transistor FDG has a configuration (planar type) common to the reset transistor RST and the selection transistor SEL, for example, as illustrated in FIG. 17. In addition, in the foregoing Modification Example A, the FD transfer transistor FDG has a configuration (planar type) common to the reset transistor RST and the selection transistor SEL, for example, as illustrated in FIG. 18. In addition, in the foregoing Modification Examples B and, C, the FD transfer transistor FDG has a configuration (planar type) common to the reset transistor RST and the selection transistor SEL, for example, as illustrated in FIG. 19. In addition, in the foregoing Modification Example D, the FD transfer transistor FDG has a configuration (vertical-gate type) common to the amplification transistor AMP, for example, as illustrated in FIGS. 20 and 21.

Modification Example F

In the foregoing embodiment and Modification Examples A to E, the amplification transistor AMP may be formed at a position opposed to the element separation section 43, for example, as illustrated in FIGS. 22 and 23. In this case, when the amplification transistor AMP has the double-gate structure or tri-gate structure described above, each of the first partial electrode 74A and the second partial electrode 74B is able to be coupled to one or a plurality of coupling sections 54, and is able to be electrically coupled to one or a plurality of floating diffusions FD via the one or the plurality of coupling sections 54. That is, the four floating diffusions FD are each linked to a lower end of the first partial electrode 74A or the second partial electrode 74B via the coupling section 54 to be thereby electrically coupled to the corresponding amplification transistor AMP. It is to be noted that the floating diffusion FD may be linked directly to the lower end of the first partial electrode 74A or the second partial electrode 74B to be thereby electrically coupled to the corresponding amplification transistor AMP. As a result, electric coupling of the plurality of floating diffusions FD is enabled by the gate electrode 74 of the amplification transistor AMP, thus eliminating the need to provide a wiring line separately. Thus, it is possible to reduce the parasitic capacitance. As a result, it is possible to suppress a decrease in the efficient conversion.

In addition, in the present modification example, the plurality of floating diffusions FD are in contact with one of the first partial electrode 74A and the second partial electrode 74B to thereby be electrically coupled to the corresponding amplification transistor AMP. This enables electrical coupling of the plurality of floating diffusions FD by the gate electrode 74 of the amplification transistor AMP, thus eliminating the need to provide a wiring line separately. Thus, it is possible to reduce the parasitic capacitance. As a result, it is possible to suppress a decrease in the efficient conversion.

In addition, in the present modification example, an element other than the amplification transistor AMP is able to be formed at a position, in the semiconductor substrate 21, not being opposed to the element separation section 43, as compared with a case where the amplification transistor AMP is formed at a position not being opposed to the element separation section 43. As a result, it is possible to enhance a degree of integration in the semiconductor substrate 21, thus enabling a decrease in the size of the imaging element 1.

Modification Example G

Figure 26:
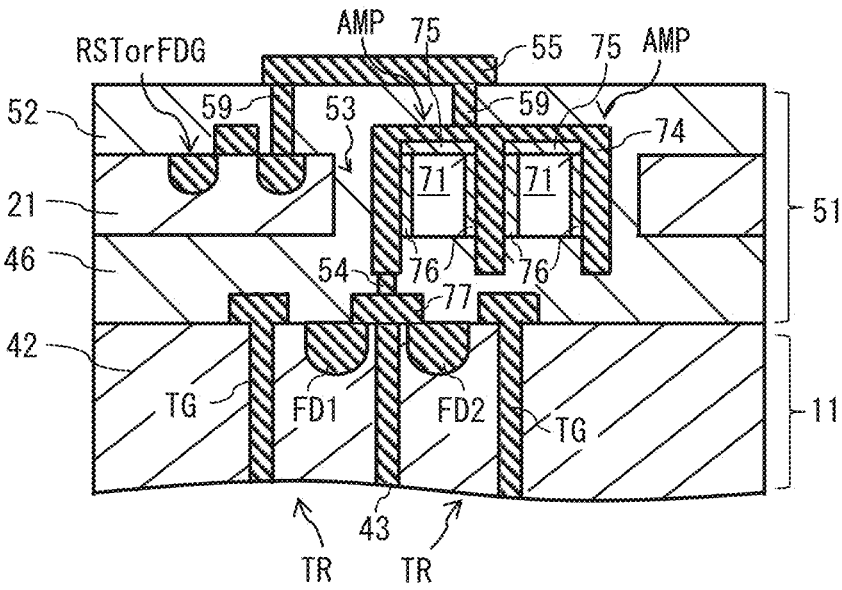
FIG. 26 illustrates a modification example of the cross-sectional configuration of FIG. 4.
Figure 27:
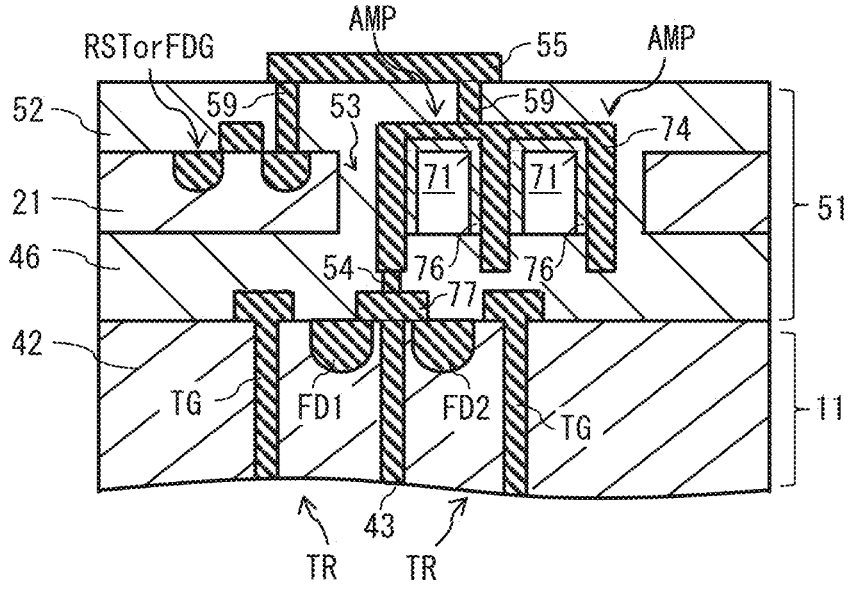
FIG. 27 illustrates a modification example of the cross-sectional configuration of FIG. 4.
Figure 28:
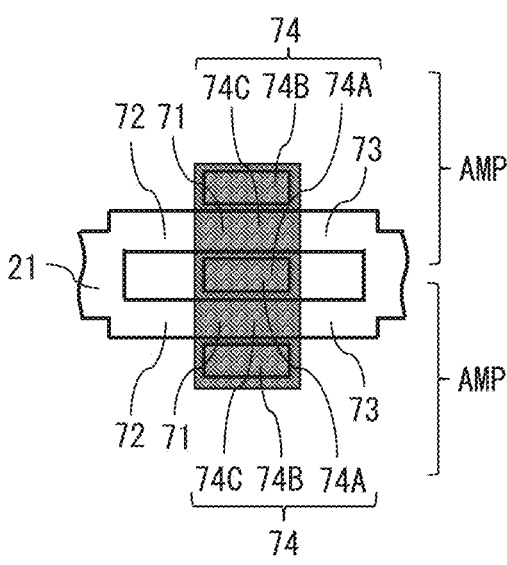
FIG. 28 illustrates a planar configuration example of two AMPs of FIGS. 26 and 27.

In the foregoing embodiment and Modification Examples A to F, the readout circuit 22 may include a plurality of amplification transistors AMP coupled in parallel to one another, for example, as illustrated in FIGS. 24, 25, 26, 27, and 28. The phrase "a plurality of amplification transistors AMP coupled in parallel to one another" may be paraphrased as one amplification transistor AMP including a plurality of sets of channel regions 71, source regions 72 and drain regions 73 arranged side by side in a predetermined direction, and the gate electrode 74 disposed to be opposed to each channel region 71 with the gate insulating film 76 interposed therebetween. FIG. 26 illustrates an example in which two amplification transistors AMP of the double-gate type are coupled in parallel to each other, and FIG. 27 illustrates an example in which two amplification transistors AMP of the tri-gate type are coupled in parallel to each other. FIG. 28 illustrates a planar configuration example of the two amplification transistors AMP coupled in parallel to each other, as depicted in FIGS. 26 and 27. In the two amplification transistors AMP coupled in parallel to each other, one amplification transistor AMP and the other amplification transistor AMP share the first partial electrode 74A, for example, as illustrated in FIG. 28.

In this case, the readout circuit 22 may include a plurality of coupling pads 77 assigned one by one for the respective groups described above. In this case, the plurality of floating diffusions FD may be further electrically coupled to the corresponding amplification transistor AMP via the coupling pad 77 in the respective groups described above. This makes it possible to decrease a size of the floating diffusion FD, as compared with the case where the coupling section 59 is coupled to the floating diffusion FD. As a result, it is possible to decrease the size of the imaging element 1.

Figure 29:
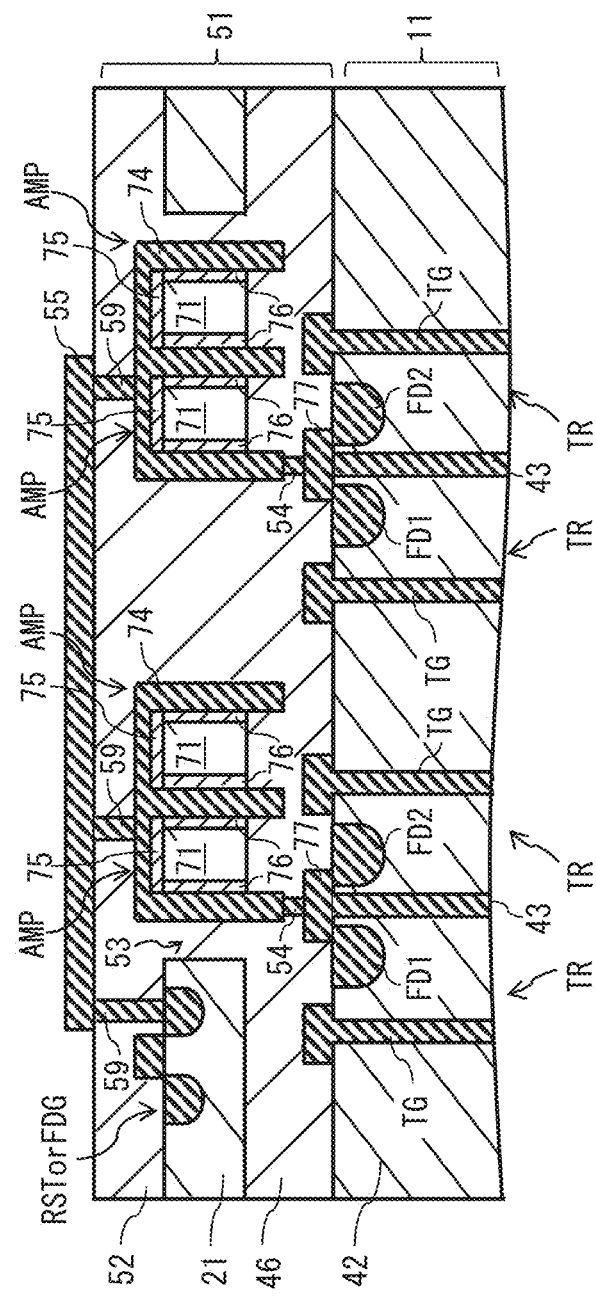
FIG. 29 illustrates a modification example of the cross-sectional configuration of FIG. 4.
Figure 30:
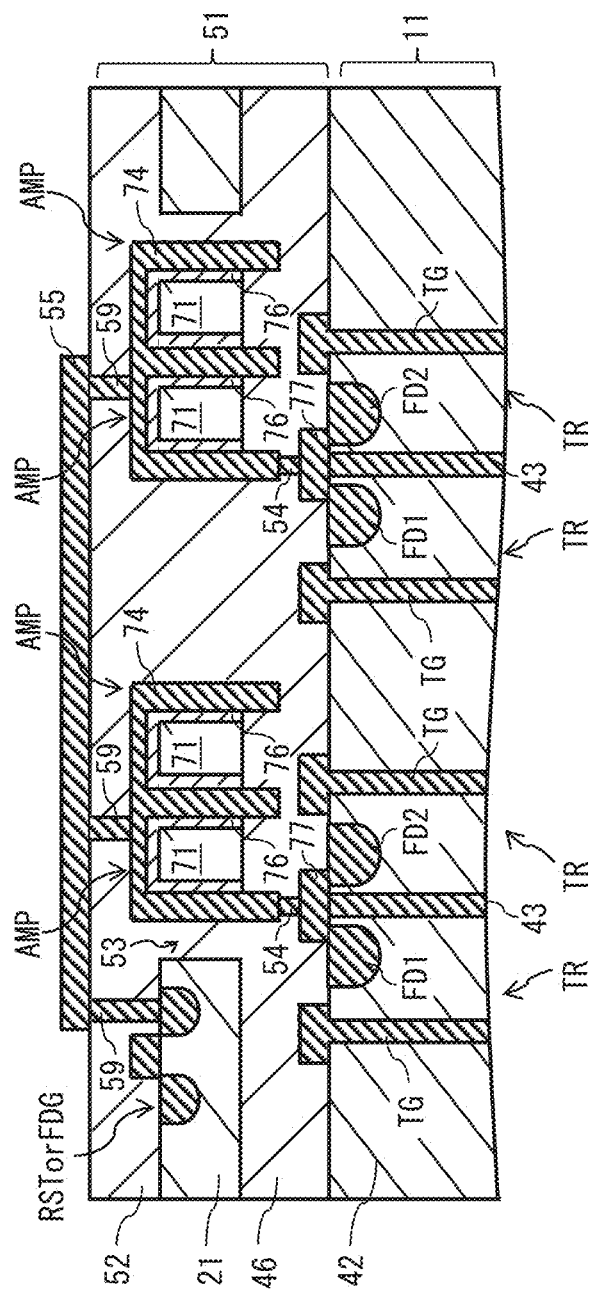
FIG. 30 illustrates a modification example of the cross-sectional configuration of FIG. 4.
Figure 31:
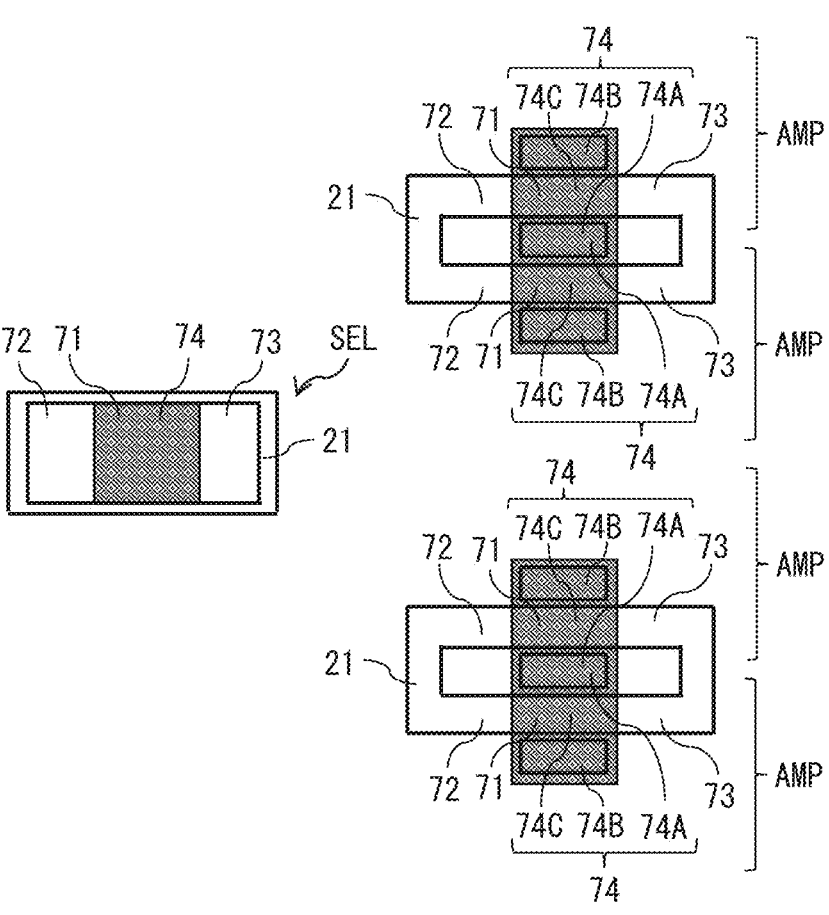
FIG. 31 illustrates a planar configuration example of an SEL and four AMPs of FIGS. 29 and 40.
Figure 32:
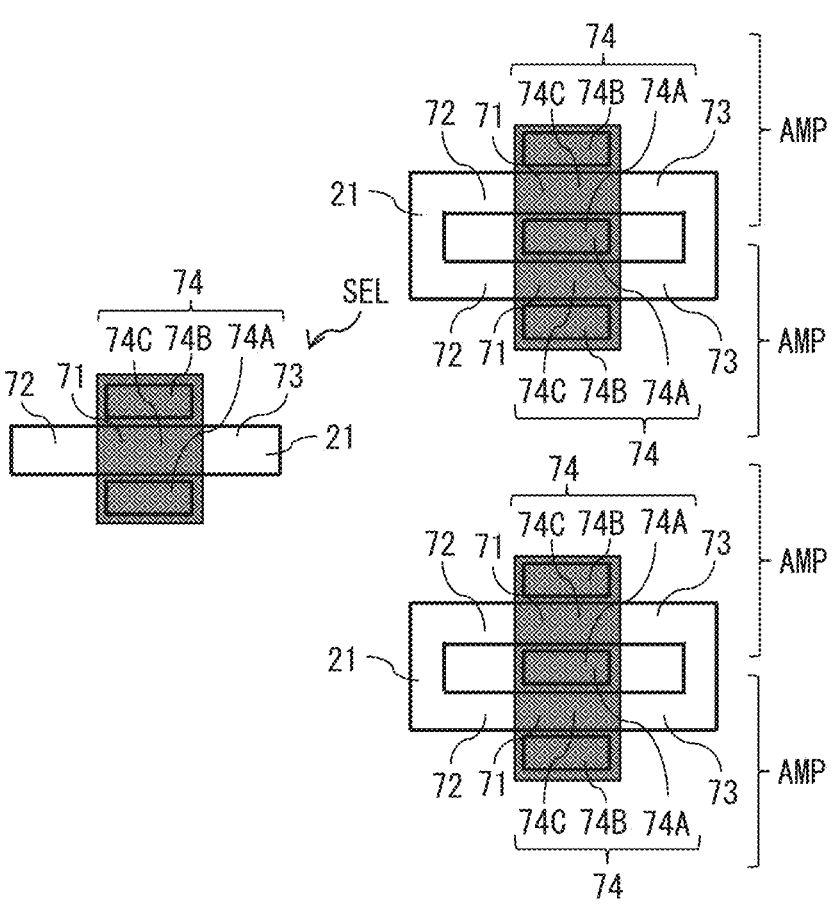
FIG. 32 illustrates a modification example of the planar configuration of FIG. 31.

In the readout circuit 22 according to the present modification example, a plurality of sets of amplification transistor groups including the plurality of amplification transistors AMP coupled in parallel to one another may be coupled in parallel to one another by the coupling wiring line 55, for example, as illustrated in FIGS. 29, 30, 31, and 32. FIG. 29 illustrates an example in which two sets of amplification transistor groups of the double-gate type are coupled in parallel to one another, and FIG. 30 illustrates an example in which two sets of amplification transistor groups of the tri-gate type are coupled in parallel to one another. FIG. 31 illustrates a planar configuration example of the amplification transistor group depicted in FIGS. 29 and 30 and the selection transistor SEL. FIG. 32 illustrates a modification example of the planar configuration of FIG. 31. FIG. 32 illustrates a planar configuration example in a case where the selection transistor SEL of the vertical-gate type is provided instead of the selection transistor SEL of the planar type of FIG. 31. As illustrated in FIGS. 31 and 32, the two amplification transistor groups and the selection transistor SEL are formed in blocks 21A separate from one another.

In such a case, the number of the sensor pixels 12 (floating diffusions FD) belonging to the above-described groups is able to be easily increased. The readout circuit 22 according to any of the foregoing embodiment and Modification Examples A to F is able to be shared by 2×4 pixels, for example, instead of 2×2 pixels.

Modification Example H

Figure 33:
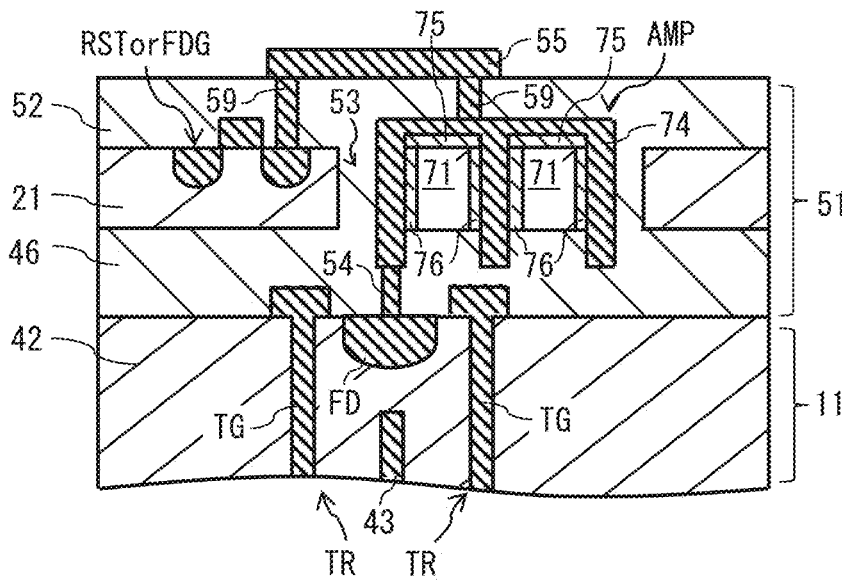
FIG. 33 illustrates a modification example of the cross-sectional configuration of FIG. 4.
Figure 34:
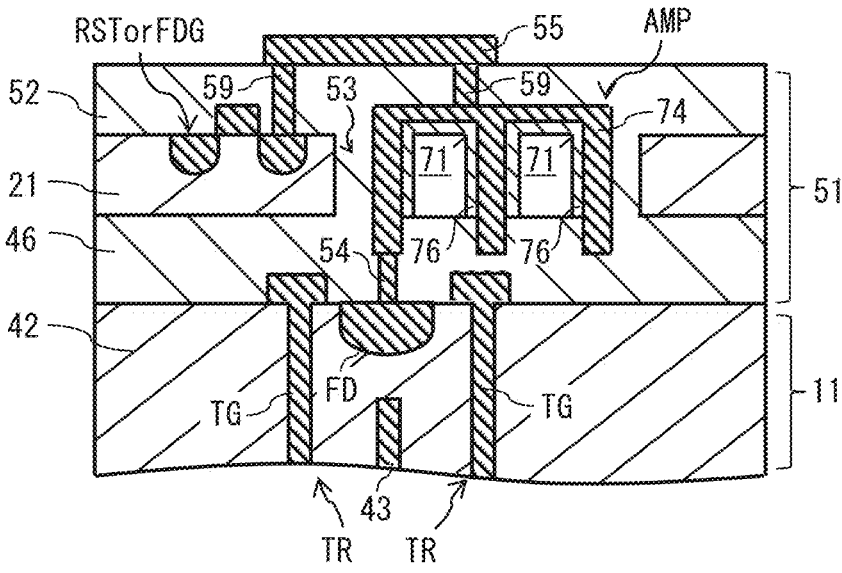
FIG. 34 illustrates a modification example of the cross-sectional configuration of FIG. 4.
Figure 35:
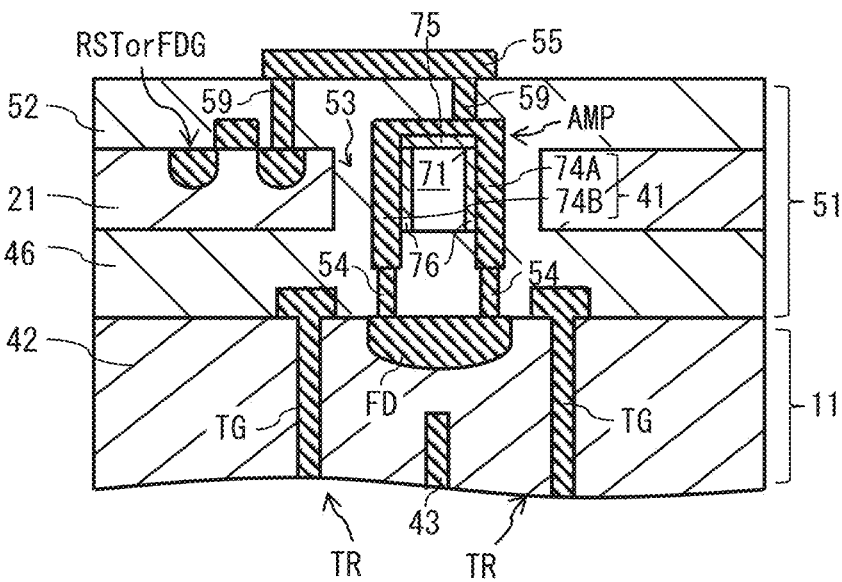
FIG. 35 illustrates a modification example of the cross-sectional configuration of FIG. 4.
Figure 36:
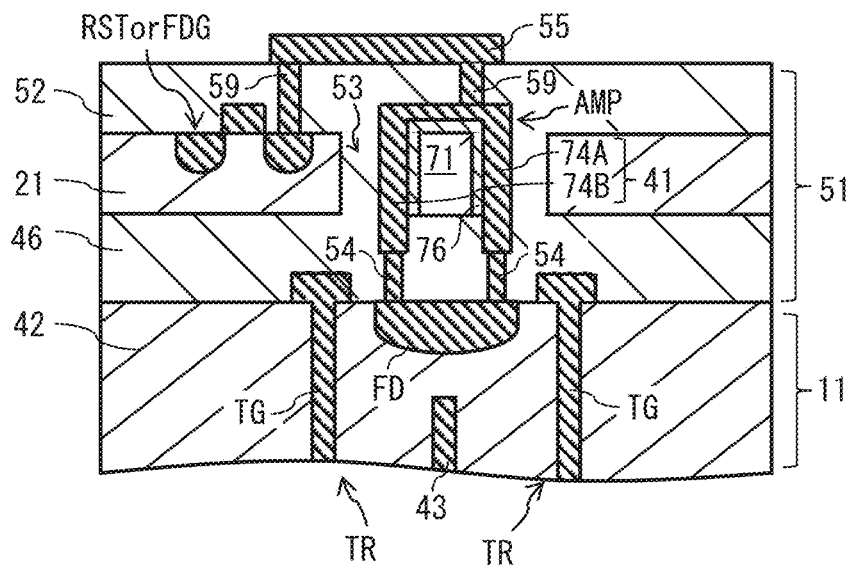
FIG. 36 illustrates a modification example of the cross-sectional configuration of FIG. 4.
Figure 37:
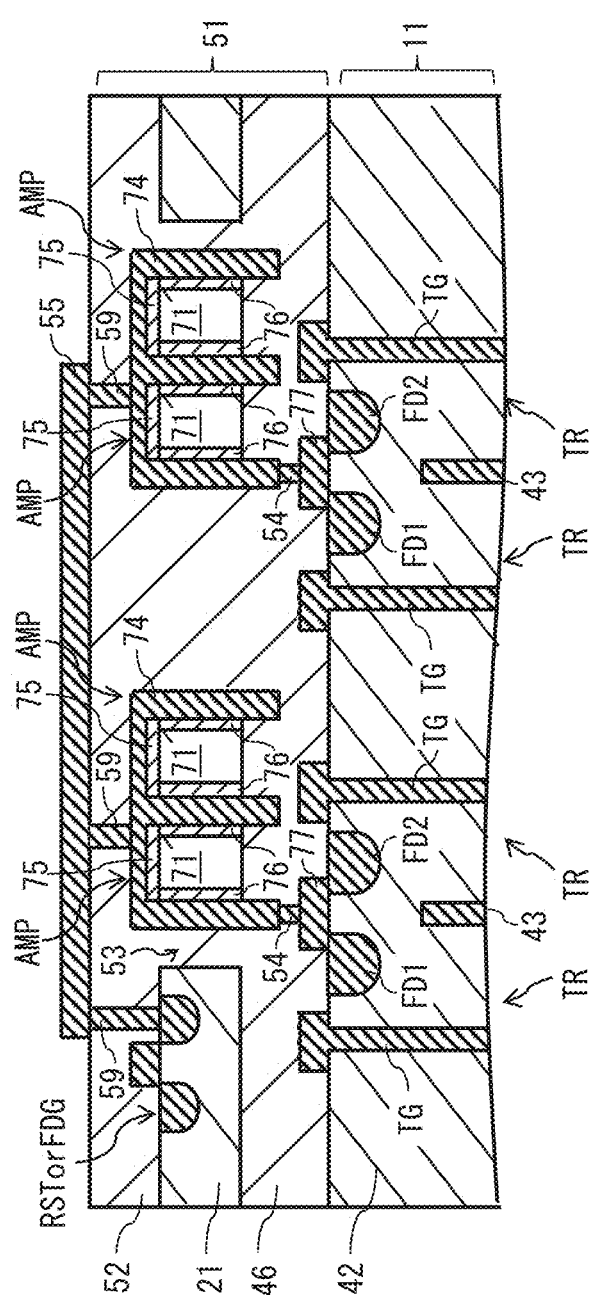
FIG. 37 illustrates a modification example of the cross-sectional configuration of FIG. 4.
Figure 38:
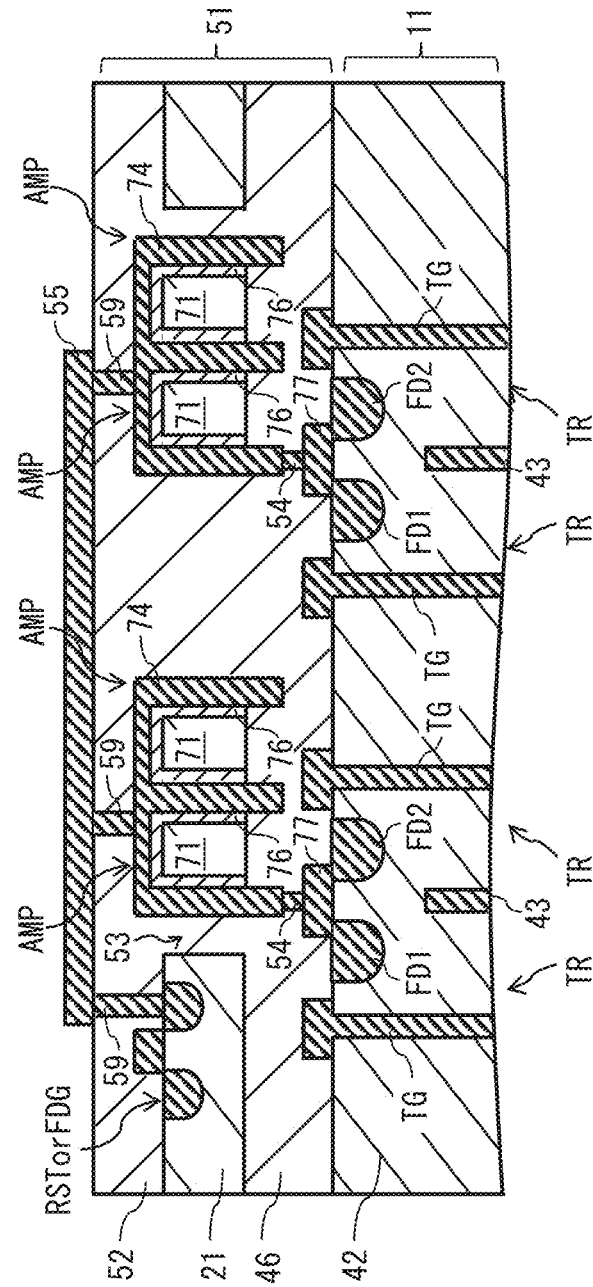
FIG. 38 illustrates a modification example of the cross-sectional configuration of FIG. 4.

In the readout circuit 22 according to any of the foregoing embodiment and Modification Examples A to G, the element separation section 43 may be formed to such a depth as not to penetrate the semiconductor substrate 11 and not to reach the top surface of the semiconductor substrate 11 (a surface on which the floating diffusion FD or the like is formed) from the light-receiving surface (back surface) of the semiconductor substrate 11, for example, as illustrated in FIGS. 33, 34, 35, 36, 37, and 38. FIG. 33 illustrates an example in which two sets of amplification transistor groups of the double-gate type are coupled in parallel to each other, and FIG. 34 illustrates an example in which two sets of amplification transistor groups of the tri-gate type are coupled in parallel to each other. FIG. 35 exemplifies a case where both the first partial electrode 74A and the second partial electrode 74B of the amplification transistor AMP of the double-gate type are in contact with the floating diffusion FD, and FIG. 36 exemplifies a case where both the first partial electrode 74A and the second partial electrode 74B of the amplification transistor AMP of the tri-gate type are in contact with the floating diffusion FD. FIG. 37 illustrates an example in which two sets of amplification transistor groups of the double-gate type are coupled in parallel to each other, and FIG. 38 illustrates an example in which two sets of amplification transistor groups of the tri-gate type are coupled in parallel to each other.

In such a case, a plurality of photodiodes PD adjacent to each other among the plurality of photodiodes PD are able to share the floating diffusion FD. At this time, the plurality of amplification transistors AMP are equally divided for each floating diffusion FD shared by the plurality of photodiodes PD, and are assigned one by one for respective floating diffusions FD each shared by the plurality of photodiodes PD. Further, the gate electrode 74 is electrically coupled to the floating diffusion FD shared by the plurality of photodiodes PD. This makes it possible to enhance a degree of integration in the semiconductor substrate 11, as compared with a case where the floating diffusion FD is not shared, thus enabling a decrease in the size of the imaging element 1.

Modification Example I

Figure 39:
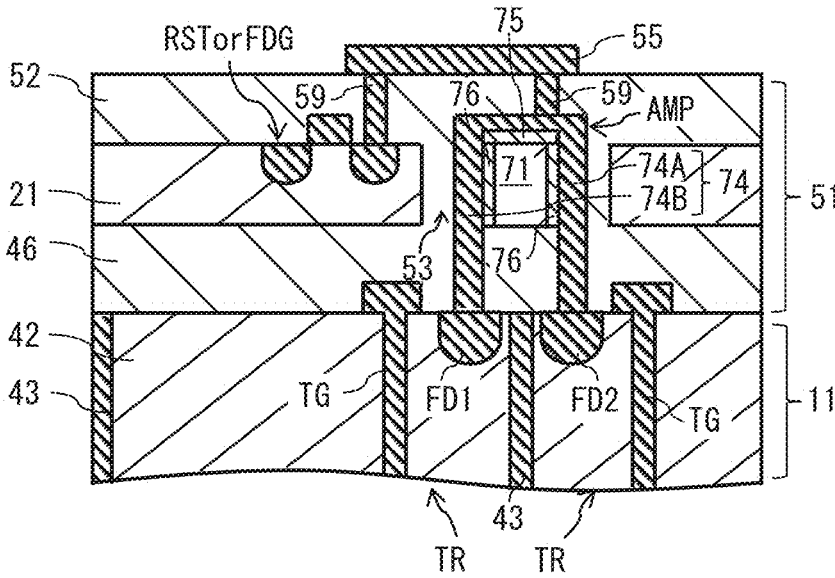
FIG. 39 illustrates a modification example of the cross-sectional configuration of FIG. 22.
Figure 40:
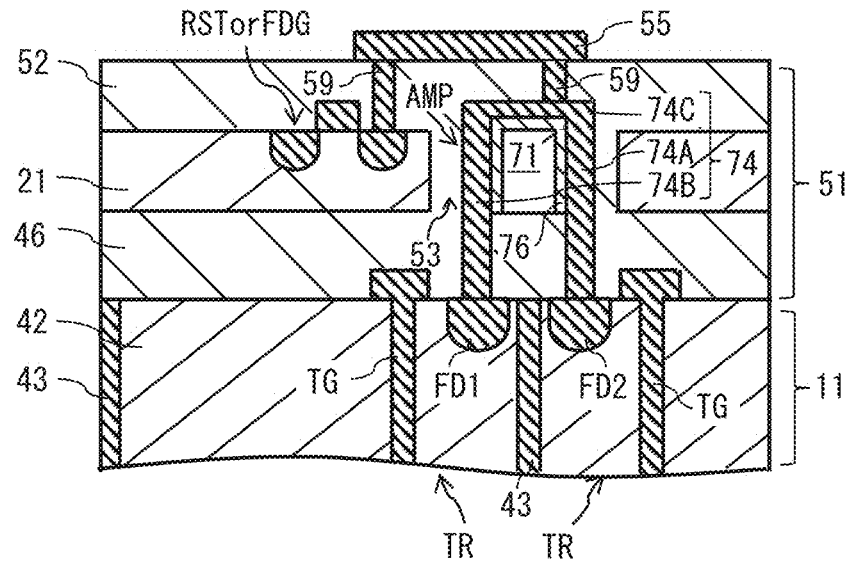
FIG. 40 illustrates a modification example of the cross-sectional configuration of FIG. 23.
Figure 41:
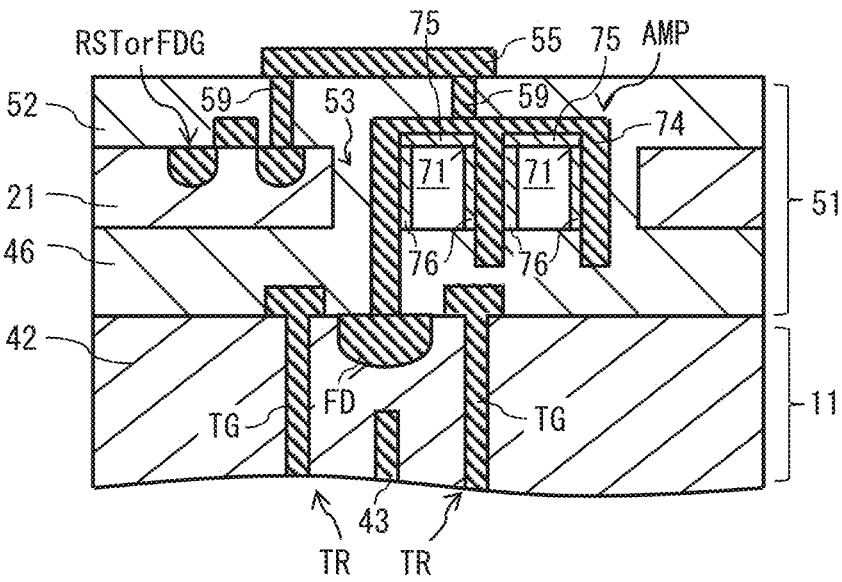
FIG. 41 illustrates a modification example of the cross-sectional configuration of FIG. 33.
Figure 42:
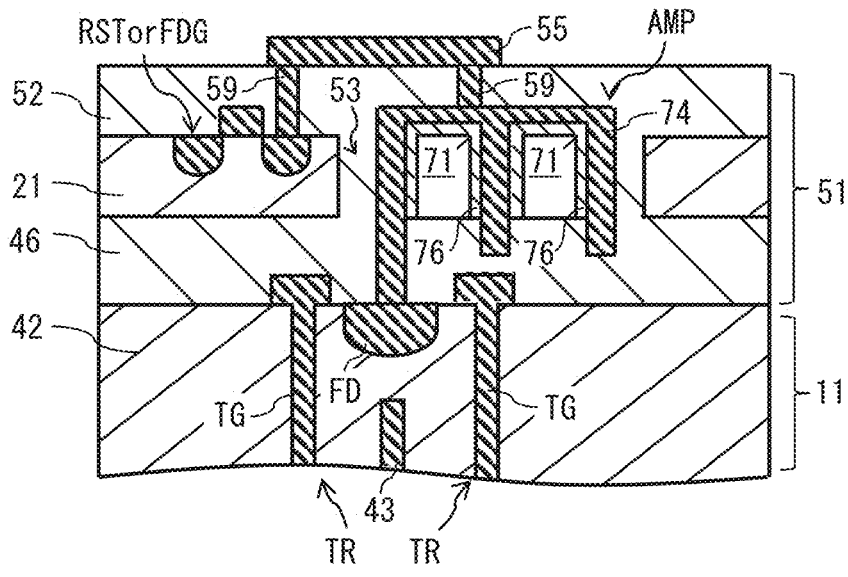
FIG. 42 illustrates a modification example of the cross-sectional configuration of FIG. 34.

In the readout circuit 22 according to any of the foregoing embodiment and Modification Examples A to H, the gate electrode 74 of the amplification transistor AMP may be in direct contact with the floating diffusion FD, for example, as illustrated in FIGS. 39, 40, 41, and 42. At this time, the gate electrode 74 of the amplification transistor AMP extends in the stacking direction, and the lower end of the gate electrode 74 of the amplification transistor AMP is in direct contact with the floating diffusion FD. It is to be noted that FIG. 39 illustrates a modification example of the cross-sectional configuration illustrated in FIG. 22. FIG. 40 illustrates a modification example of the cross-sectional configuration illustrated in FIG. 23. FIG. 41 illustrates a modification example of the cross-sectional configuration illustrated in FIG. 33. FIG. 42 illustrates a modification example of the cross-sectional configuration illustrated in FIG. 34. In such a case, the coupling section 54 that couples the gate electrode 74 of the amplification transistor AMP and the floating diffusion FD together may be omitted, thus making it possible to reduce the manufacturing step by the omission of the coupling section 54. In addition, a vibration transmission distance from the floating diffusion FD to the gate electrode 74 of the amplification transistor AMP is shortened, which leads to faster signal transmission, thus enabling noise reduction.

Modification Example J

In the readout circuit 22 according to any of the foregoing embodiment and Modification Examples A to I, one readout circuit 22 may be provided for each sensor pixel 12, for example, as illustrated in FIG. 43. In this case, the gate electrode 74 of the amplification transistor AMP may be in direct contact with the floating diffusion FD, for example, as illustrated in FIG. 44. At this time, the gate electrode 74 of the amplification transistor AMP extends in the stacking direction, and the lower end of the gate electrode 74 of the amplification transistor AMP is in direct contact with the floating diffusion FD. In such a case, the coupling section 54 that couples the gate electrode 74 of the amplification transistor AMP and the floating diffusion FD together may be omitted, thus making it possible to reduce the manufacturing step by the omission of the coupling section 54. In addition, a vibration transmission distance from the floating diffusion FD to the gate electrode 74 of the amplification transistor AMP is shortened, which leads to faster signal transmission, thus enabling noise reduction.

Modification Example K

In the second substrate 20 according to any of the foregoing embodiment and Modification Examples A to J, the amplification transistor AMP, the reset transistor RST and the selection transistor SEL that are able to configure the readout circuit 22 are formed in the same semiconductor substrate 21. However, in the second substrate 20 according to any of the foregoing embodiment and Modification Examples A to J, for example, at least one transistor included in the readout circuit 22 may be formed in the semiconductor substrate 21, and remaining transistors may be formed in a semiconductor substrate 21A different from the semiconductor substrates 11 and 21. At this time, for example, the second substrate 20 may be formed by forming the insulating layers 52 and 57, the coupling section 59 and the coupling wiring line 55 on the semiconductor substrate 21 and further stacking the semiconductor substrate 21A, although no illustration is given thereof. The semiconductor substrate 21A is stacked inside a region on side opposite to side of the semiconductor substrate 11 in a positional relationship with respect to the interlayer insulating film 51, thus enabling formation of a desired transistor. As an example, the amplification transistor AMP can be formed in the semiconductor substrate 21, and the reset transistor RST and/or the selection transistor SEL can be formed in the semiconductor substrate 21A.

In addition, a plurality of new semiconductor substrates may be provided for the second substrate 20 according to any of the foregoing embodiment and Modification Examples A to J, and a desired transistor included in the readout circuit 22 may be provided for each thereof. As an example, the amplification transistor AMP may be formed in the semiconductor substrate 21. Further, an insulating layer, a coupling section and a coupling wiring line are stacked on the semiconductor substrate 21, and the semiconductor substrate 21A is stacked thereon, thus enabling formation of the reset transistor RST in the semiconductor substrate 21A. An insulating layer, a coupling section and a coupling wiring line are stacked on the semiconductor substrate 21A, and a semiconductor substrate 21B is stacked thereon, thus enabling formation of the selection transistor SEL in the semiconductor substrate 21B. A transistor to be formed in the semiconductor substrates 21, 21A, and 21B may be any transistor configuring the readout circuit 22.

In this manner, providing the plurality of semiconductor substrates in the second substrate 20 makes it possible to reduce an area, of the semiconductor substrate 21, occupied by one readout circuit 22. Enabling an area of each readout circuit 22 to be reduced or each transistor to be miniaturized also enables an area of the chip to be reduced. In addition, it is possible to expand an area of a desired transistor, among the amplification transistor AMP, the reset transistor RST and the selection transistor SEL that are able to configure the readout circuit 22. In particular, it is also possible to expect noise reduction effects by expanding an area of the amplification transistor AMP.

3. APPLICATION EXAMPLE

FIG. 45 illustrates an example of a schematic configuration of an imaging system 2 including the imaging element 1 according to any of the foregoing embodiment and modification examples thereof.

The imaging system 2 is an electronic apparatus including, for example, an imaging apparatus such as a digital still camera or a video camera, or a portable terminal apparatus such as a smartphone or a tablet-type terminal. The imaging system 2 includes, for example, the imaging element 1 according to any of the foregoing embodiment and modification examples thereof, an optical system 141, a shutter device 142, a control circuit 143, a DSP circuit 144, a frame memory 145, a display unit 146, a storage unit 147, an operation unit 148, and a power source unit 149. In the imaging system 2, the imaging element 1 according to any of the foregoing embodiment and modification examples thereof, the DSP circuit 144, the frame memory 145, the display unit 146, the storage unit 147, the operation unit 148, and the power source unit 149 are coupled to one another via a bus line 150.

The optical system 141 is configured by one or a plurality of lenses, and guides light (incident light) from a subject to the imaging element 1 to form an image on a light-receiving surface of the imaging element 1. The shutter device 142 is disposed between the optical system 141 and the imaging element 1, and controls periods of light irradiation and light shielding with respect to the imaging element 1 under the control of the control circuit 143. The imaging element 1 accumulates signal charges for a certain period of time in response to light imaged on the light-receiving surface through the optical system 141 and the shutter device 142. The signal charges accumulated in the imaging element 1 are transferred, as a pixel signal (image data), to the DSP circuit 144 in accordance with a drive signal (timing signal) supplied from the control circuit 143. That is, the imaging element 1 receives image light (incident light) incident through the optical system 141 and the shutter device 142, and outputs a pixel signal corresponding to the received image light (incident light) to the DSP circuit 144. The control circuit 143 outputs a drive signal to control a transfer operation of the imaging element 1 and a shutter operation of the shutter device 142 to drive the imaging element 1 and the shutter device 142.

The DSP circuit 144 is a signal processing circuit that processes a pixel signal (image data) outputted from the imaging element 1. The frame memory 145 temporarily holds the image data processed by the DSP circuit 144 in a frame unit. The display unit 146 includes, for example, a panel-type display device such as a liquid crystal panel or an organic EL (Electro Luminescence) panel, and displays a moving image or a still image captured by the imaging element 1. The storage unit 147 records image data of a moving image or a still image captured by the imaging element 1 in a recording medium such as a semiconductor memory or a hard disk. The operation unit 148 issues an operation command for various functions of the imaging system 2 in accordance with an operation by a user. The power source unit 149 appropriately supplies various types of power for operation to the imaging element 1, the DSP circuit 144, the frame memory 145, the display unit 146, the storage unit 147, and the operation unit 148 which are supply targets.

Next, description is given of an imaging procedure in the imaging system 2.

FIG. 46 illustrates an example of a flowchart of an imaging operation in the imaging system 2. A user instructs start of imaging by operating the operation unit 148 (step S101). Then, the operation unit 148 transmits an imaging command to the control circuit 143 (step S102). Upon receiving the imaging command, the control circuit 143 starts controlling the shutter device 142 and the imaging element 1. The imaging element 1 (specifically, system control circuit 32d) executes imaging in a predetermined imaging method under the control of the control circuit 143 (step S103). The shutter device 142 controls periods of light irradiation and light shielding with respect to the imaging element 1 under the control of the control circuit 143.

The imaging element 1 outputs image data obtained by the imaging to the DSP circuit 144. As used herein, the image data refers to data for all pixels of pixel signals generated on the basis of charges temporarily held in the floating diffusion FD. The DSP circuit 144 performs predetermined signal processing (e.g., noise reduction processing, etc.) on the basis of the image data inputted from the imaging element 1 (step S104). The DSP circuit 144 causes the frame memory 145 to hold the image data having been subjected to the predetermined signal processing, and the frame memory 145 causes the storage unit 147 to store the image data (step S105). In this manner, the imaging in the imaging system 2 is performed.

In the present application example, the imaging element 1 according to the foregoing embodiment and modification examples thereof is applied to the imaging system 2. This enables smaller size or higher definition of the imaging element 1, thus making it possible to provide a small or high-definition imaging system 2.

4. PRACTICAL APPLICATION EXAMPLES

Practical Application Example 1

The technology according to an embodiment of the present disclosure (present technology) is applicable to various products. For example, the technology according to an embodiment of the present disclosure may be achieved in the form of an apparatus to be mounted to a mobile body of any kind. Non-limiting examples of the mobile body may include an automobile, an electric vehicle, a hybrid electric vehicle, a motorcycle, a bicycle, any personal mobility device, an airplane, an unmanned aerial vehicle (drone), a vessel, and a robot.

FIG. 47 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 47, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 47, an audio speaker 12061, a display section 12062, and an instrument panel 12063 are illustrated as the output device. The display section 12062 may, for example, include at least one of an on-board display and a head-up display.

FIG. 48 is a diagram depicting an example of the installation position of the imaging section 12031.

In FIG. 48, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 48 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The description has been given hereinabove of one example of the mobile body control system, to which the technology according to an embodiment of the present disclosure may be applied. The technology according to an embodiment of the present disclosure may be applied to the imaging section 12031 among components of the configuration described above. Specifically, the imaging element 1 according to any of the foregoing embodiment and modification examples thereof is applicable to the imaging section 12031. The application of the technology according to an embodiment of the present disclosure to the imaging section 12031 enables suppression of a decrease in efficient conversion of the imaging section 12031, thus making it possible to provide a mobile body control system having high image quality.

Practical Application Example 2

FIG. 49 is a view depicting an example of a schematic configuration of an endoscopic surgery system to which the technology according to an embodiment of the present disclosure (present technology) can be applied.

In FIG. 49, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 50 is a block diagram depicting an example of a functional configuration of the camera head 11102 and the CCU 11201 depicted in FIG. 49.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The description has been given above of one example of the endoscopic surgery system, to which the technology according to an embodiment of the present disclosure is applicable. The technology according to an embodiment of the present disclosure is suitably applicable to, for example, the image pickup unit 11402 provided in the camera head 11102 of the endoscope 11100, among the configurations described above. Applying the technology according to an embodiment of the present disclosure to the image pickup unit 11402 enables suppression of a decrease in efficient conversion of the image pickup unit 11402, thus making it possible to provide the endoscope 11100 having high image quality.

Although the description has been given hereinabove of the present disclosure with reference to the embodiment and modification examples thereof, the application example, and the practical application examples, the present disclosure is not limited to the foregoing embodiment, etc., and various modifications may be made. It is to be noted that the effects described herein are merely illustrative. The effects of the present disclosure are not limited to those described herein. The present disclosure may have other effects than those described herein.

5. OTHER APPLICATION EXAMPLES

The present disclosure is not limited to, for example, the imaging element, but is also applicable to, for example, a semiconductor element. For example, the components of the imaging element 1 according to the foregoing embodiment and modification examples thereof are applicable to the semiconductor element.

For example, the components of the imaging element 1 according to the foregoing embodiment and modification examples thereof are also applicable to a semiconductor element 3, for example, as illustrated in FIG. 51.

The semiconductor element 3 is a stacked body in which a semiconductor substrate 310, an insulating layer 330, a semiconductor substrate 320 and an insulating layer 340 are stacked in this order. The semiconductor substrates 310 and 320 are each, for example, a silicon substrate. The insulating layers 330 and 340 are each configured by an inorganic insulating material such as $SiO_2$ or SiN, for example. The semiconductor substrate 320 includes, in the same layers as the semiconductor substrate 320, an insulating layer 350 that penetrates the semiconductor substrate 320. The insulating layer 350 is configured by an inorganic insulating material such as $SiO_2$ or SiN, for example.

The semiconductor substrate 310 includes a transistor 311, for example. The transistor 311 corresponds to a specific example of a "first transistor" of the present disclosure. The semiconductor substrate 320 is stacked over the semiconductor substrate 310 with the insulating layer 330 interposed therebetween, and includes, for example, a transistor 321 having a configuration common to the amplification transistor AMP described in the foregoing embodiment, etc., and a transistor 322. The transistor 321 corresponds to a specific example of a "second transistor" of the present disclosure. A gate electrode 321B of the transistor 321 and a source or a drain of the transistor 322 are electrically coupled together, for example, by coupling sections 341 and 342 provided inside the insulating layer 340 and a wiring line 343 provided on the insulating layer 340. The gate electrode 321B is formed by impurity-doped polysilicon, silicided silicon, or a metal material that controls a work function.

The transistor 321 includes, for example, a channel region 321A, a source region and a drain region inside an inner surface of an opening formed by selective etching with respect to the semiconductor substrate 320. That is, the transistor 321 includes the channel region 321A, the source region and the drain region in a plane intersecting a front surface of the semiconductor substrate 320. The transistor 321 further includes a gate insulating film 321D in contact with the channel region 321A, and includes a gate electrode 321B opposed to the channel region 321A with the gate insulating film 321D interposed therebetween.

The gate electrode 321B extends in a direction parallel to a plane in which the channel region 321A, the source region and the drain region are formed (i.e., a thickness direction of the semiconductor substrate 320). The gate electrode 321B further extends into the insulating layer 330. A lower end of the gate electrode 321B is in contact with a coupling section 331, and is electrically coupled to a source or a drain of the transistor 311 via the coupling section 331. That is, a wiring line that electrically couples the gate electrode 321B and the source or the drain of the transistor 311 together is formed at the shortest distance between the gate electrode 321B and the source or the drain of the transistor 311 without passing through the inside of the insulating layer 340.

It is to be noted that the gate electrode 321B may have, for example, a double-gate structure sandwiching the channel region from a direction parallel to the front surface of the semiconductor substrate 320, similarly to the gate electrode 74 depicted in FIG. 7. At this time, the transistor 321 may be, for example, a junctionless transistor in which the channel region 321A, the source region and the drain region have the same polarity. In addition, similarly to the gate electrode 74 depicted in FIG. 10, the gate electrode 321B may have, for example, a tri-gate structure sandwiching the channel region 321A from the direction parallel to the front surface of the semiconductor substrate 320 and being opposed to the channel region 321A with the gate insulating film 321D interposed therebetween in a direction intersecting the front surface of the semiconductor substrate 320. At this time, the transistor 321 may be, for example, a junctionless transistor in which the channel region 321A, the source region and the drain region have the same polarity.

In addition, a part opposed to the channel region 321A in the gate electrode 321B and the coupling section 331 may be formed collectively, or may be formed separately in the course of manufacturing. In a case where the part opposed to the channel region 321A in the gate electrode 321B and the coupling section 331 are formed separately in the course of manufacturing, the part opposed to the channel region 321A in the gate electrode 321B and the coupling section 331 may be formed by the same material or may be formed by different materials.

In addition, the semiconductor substrate 320 may have a plurality of transistors 321 coupled in parallel to one another, for example, similarly to the amplification transistors AMP depicted in FIGS. 26, 27, 29, and 30. The phrase "a plurality of transistors 321 coupled in parallel to one another" may be paraphrased as one transistor including a plurality of sets of channel regions 321A, source regions and drain regions arranged side by side in a predetermined direction, and the gate electrode 321B disposed to be opposed to each channel region 321A with the gate insulating film 321D interposed therebetween.

In addition, for example, the components of the imaging element 1 according to the foregoing embodiment and modification examples thereof are applicable to a semiconductor element 4 as illustrated in FIG. 52, for example. The semiconductor element 4 has a configuration in which a photodiode 312 is provided instead of the transistor 311 in the semiconductor element 3. The photodiode 312 is electrically coupled to the coupling section 331.

In addition, the present disclosure may also have the following configurations.

(1)

An imaging element including:

a first semiconductor substrate including a photoelectric conversion section and a charge-holding section that holds charges transferred from the photoelectric conversion section; and a second semiconductor substrate stacked over the first semiconductor substrate with an insulating layer interposed therebetween, the second semiconductor substrate including an amplification transistor that generates a signal of a voltage corresponding to a level of charges held in the charge-holding section, the amplification transistor including a channel region, a source region, and a drain region in a plane intersecting a front surface of the second semiconductor substrate, and including a gate electrode being opposed to the channel region with a gate insulating film interposed therebetween and being electrically coupled to the charge-holding section.

(2)

The imaging element according to (1), in which the gate electrode has a double-gate structure sandwiching the channel region from a first direction parallel to the front surface of the second semiconductor substrate.

(3)

The imaging element according to (1), in which the gate electrode has a tri-gate structure sandwiching the channel region from a first direction parallel to the front surface of the second semiconductor substrate and being opposed to the channel region with the gate insulating film interposed therebetween in a second direction intersecting the front surface of the second semiconductor substrate.

(4)

The imaging element according to any one of (1) to (3), in which the amplification transistor includes a junctionless transistor in which the channel region, the source region, and the drain region have same polarity.

(5)

The imaging element according to any one of (1) to (4), in which the amplification transistor includes a plurality of sets of the channel regions, the source regions, and the drain regions which are arranged side by side in the first direction, and the gate electrode is disposed to be opposed to each of the channel regions with the gate insulating film interposed therebetween in the amplification transistor.

(6)

The imaging element according to any one of (1) to (5), in which the gate electrode is formed by impurity-doped polysilicon, silicided silicon, or a metal material that controls a work function.

(7)

The imaging element according to (2), in which
the first semiconductor substrate includes an element separation section that separates a plurality of the photoelectric conversion sections for the respective photoelectric conversion sections, and the amplification transistor is formed at a position opposed to the element separation section.

(8)

The imaging element according to (7), in which a plurality of the charge-holding sections are equally divided into a plurality of groups, a plurality of the amplification transistors are equally divided for the respective groups, the gate electrode includes a first partial electrode and a second partial electrode that sandwich the channel region from the first direction, and the plurality of the charge-holding sections are electrically coupled to corresponding ones of the amplification transistors in the respective groups by being linked to a lower end of one of the first partial electrode and the second partial electrode directly or via a coupling section.

(9)

The imaging element according to (7), in which a plurality of the charge-holding sections are equally divided into a plurality of groups, a plurality of the amplification transistors are equally divided for the respective groups, the imaging element further includes a plurality of coupling pads assigned for the respective groups, and the plurality of the charge-holding sections are electrically coupled to corresponding ones of the amplification transistors via the coupling pads in the respective groups.

(10)

The imaging element according to (7), in which a plurality of the photoelectric conversion sections adjacent to each other among the plurality of the photoelectric conversion sections share the charge-holding section, a plurality of the amplification transistors are equally divided for each charge-holding section shared by the plurality of the photoelectric conversion sections, and the gate electrode is electrically coupled to the charge-holding section shared by the plurality of the photoelectric conversion sections.

(11)

The imaging element according to (3), in which the first semiconductor substrate includes an element separation section that separates a plurality of the photoelectric conversion sections for the respective photoelectric conversion sections, and the amplification transistor is formed at a position opposed to the element separation section.

(12)

The imaging element according to (11), in which a plurality of the charge-holding sections are equally divided into a plurality of groups, a plurality of the amplification transistors are equally divided for the respective groups, the gate electrode includes a first partial electrode and a second partial electrode that sandwich the channel region from the first direction, and a third partial electrode being opposed to the channel region with the gate insulating film interposed therebetween in the second direction and being in contact with the first partial electrode and the second partial electrode, and the plurality of the charge-holding sections are electrically coupled to corresponding ones of the amplification transistors in the respective groups by being linked to a lower end of one of the first partial electrode and the second partial electrode directly or via a coupling section.

(13)

The imaging element according to (11), in which a plurality of the charge-holding sections are equally divided into a plurality of groups, a plurality of the amplification transistors are equally divided for the respective groups, the imaging element further includes a plurality of coupling pads assigned for the respective groups, and the plurality of the charge-holding sections are electrically coupled to corresponding ones of the amplification transistors via the coupling pads in the respective groups.

(14)

The imaging element according to (11), in which a plurality of the photoelectric conversion sections adjacent to each other among the plurality of the photoelectric conversion sections share the charge-holding section, a plurality of the amplification transistors are equally divided for each charge-holding section shared by the plurality of the photoelectric conversion sections, and the gate electrode is electrically coupled to the charge-holding section shared by the plurality of the photoelectric conversion sections.

(15)

A semiconductor element including:

a first semiconductor substrate including a first transistor or a photoelectric conversion section; and a second semiconductor substrate stacked over the first semiconductor substrate with an insulating layer interposed therebetween, the second semiconductor substrate including a second transistor, the second transistor including a channel region, a source region, and a drain region in a plane intersecting a front surface of the second semiconductor substrate, and including a gate electrode being opposed to the channel region with a gate insulating film interposed therebetween and being electrically coupled to the first semiconductor substrate.

(16)

The semiconductor element according to (15), in which the gate electrode has a double-gate structure sandwiching the channel region from a first direction parallel to the front surface of the second semiconductor substrate.

(17)

The semiconductor element according to (15), in which the gate electrode has a tri-gate structure sandwiching the channel region from a first direction parallel to the front surface of the second semiconductor substrate and being opposed to the channel region with the gate insulating film interposed therebetween in a second direction intersecting the front surface of the second semiconductor substrate.

(18)

The semiconductor element according to (15), in which the second transistor includes a junctionless transistor in which the channel region, the source region, and the drain region have same polarity.

(19)

The semiconductor element according to (15), in which the second transistor includes a plurality of sets of the channel regions, the source regions, and the drain regions which are arranged side by side in the first direction, and the gate electrode is disposed to be opposed to each of the channel regions with the gate insulating film interposed therebetween in the second transistor.

(20)

The semiconductor element according to (15), in which the gate electrode is formed by impurity-doped polysilicon, silicided silicon, or a metal material that controls a work function.

According to the imaging element of an embodiment of the present disclosure, it is possible to shorten the length of the wiring line coupling the amplification transistor and the charge-holding section together and thus to reduce parasitic capacitance. This enables suppression of a decrease in efficient conversion.

According to the semiconductor element of an embodiment of the present disclosure, it is possible to shorten the length of the wiring line coupling the second transistor and the first semiconductor substrate together and thus to reduce parasitic capacitance. This enables suppression of a decrease in efficient conversion.

It is to be noted that the effects of the present technology are not necessarily limited to the effects described herein, and may be any of the effects described herein.

This application claims the benefit of Japanese Priority Patent Application JP2019-048551 filed with the Japan Patent Office on Mar. 15, 2019, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A light detecting device, comprising:
a first substrate including a photoelectric conversion section and a charge-holding section that holds charges transferred from the photoelectric conversion section; and
a second substrate including an amplification transistor that generates a signal of a voltage corresponding to a level of charges held in the charge-holding section,
wherein a gate electrode of the amplification transistor is electrically coupled to the charge-holding section,
wherein the gate electrode of the amplification transistor has a first portion and a second portion,
wherein the first portion is perpendicular to the second portion, and
wherein the first substrate includes a first wiring layer, and wherein the first wiring layer includes a first wiring that contacts the charge-holding section.

2. The light detecting device according to claim 1, wherein the gate electrode of the amplification transistor includes a third portion, and wherein the third portion is perpendicular to the first portion and the third portion is parallel to the second portion.

3. The light detecting device according to claim 2, wherein the first portion is extended parallel to a surface of the second substrate, and wherein the second portion and the third portion are extended in a vertical direction from the surface of the second substrate.

4. The light detecting device according to claim 2, wherein a part of semiconductor region of the second substrate is disposed between the second portion and the third portion.

5. The light detecting device according to claim 1, wherein the first portion is extended parallel to a surface of the second substrate and the second portion is extended in a vertical direction from the surface of the second substrate.

6. The light detecting device according to claim 1, wherein the second substrate includes a reset transistor.

7. The light detecting device according to claim 6, wherein a gate electrode of the reset transistor includes has a first portion and a second portion, and wherein the first portion is perpendicular to the second portion.

8. The light detecting device according to claim 7, wherein the gate electrode of the reset transistor includes a third portion, and wherein the third portion is perpendicular to the first portion and the third portion is parallel to the second portion.

9. The light detecting device according to claim 8, wherein a part of semiconductor region of the second substrate is disposed between the second portion and the third portion.

10. The light detecting device according to claim 8, wherein the first portion is extended parallel to a surface of the second substrate, and wherein the second portion and the third portion are extended in a vertical direction from the surface of the second substrate.

11. The light detecting device according to claim 1, wherein the second substrate includes a select transistor.

12. The light detecting device according to claim 11, wherein a gate electrode of the select transistor includes has a first portion and a second portion, and wherein the first portion is perpendicular to the second portion.

13. The light detecting device according to claim 12, wherein the gate electrode of the select transistor includes a third portion, and wherein the third portion is perpendicular to the first portion and the third portion is parallel to the second portion.

14. The light detecting device according to claim 13, wherein a part of semiconductor region of the second substrate is disposed between the second portion and the third portion.

15. The light detecting device according to claim 13, wherein the first portion is extended parallel to a surface of the second substrate, and wherein the second portion and the third portion are extended in a vertical direction from the surface of the second substrate.

16. The light detecting device according to claim 1, wherein the gate electrode of the amplification transistor is formed by impurity-doped polysilicon, silicided silicon, or a metal material that controls a work function.

17. The light detecting device according to claim 1, wherein the first substrate includes a first wiring layer, and wherein the first wiring layer includes a first wiring that contacts the second portion of the gate electrode of the amplification transistor.

18. The light detecting device according to claim 1, wherein the second substrate includes a second wiring layer, the second wiring layer includes a second wiring which contacts the first portion of the gate electrode of the amplification transistor and a reset transistor or a select transistor.

19. A light detecting device, comprising:
a first substrate including a photoelectric conversion section and a charge-holding section that holds charges transferred from the photoelectric conversion section; and
a second substrate including an amplification transistor that generates a signal of a voltage corresponding to a level of charges held in the charge-holding section,
wherein a gate electrode of the amplification transistor is electrically coupled to the charge-holding section,
wherein the gate electrode of the amplification transistor has a first portion and a second portion, wherein the first portion is perpendicular to the second portion, and wherein the first portion of the gate electrode of the amplification transistor contacts the charge-holding section.

20. A light detecting device, comprising:

a first substrate including a photoelectric conversion section and a charge-holding section that holds charges transferred from the photoelectric conversion section; and a second substrate including an amplification transistor that generates a signal of a voltage corresponding to a level of charges held in the charge-holding section, wherein a gate electrode of the amplification transistor is electrically coupled to the charge-holding section, wherein the gate electrode of the amplification transistor has a first portion and a second portion, wherein the first portion is perpendicular to the second portion, wherein the first substrate includes a first wiring layer, and wherein the first wiring layer includes a first wiring that contacts the second portion of the gate electrode of the amplification transistor.

* * * * *